(12) United States Patent
Oda

(10) Patent No.: US 8,785,863 B2
(45) Date of Patent: Jul. 22, 2014

(54) RADIATION DETECTION DEVICE, CONTROL METHOD FOR RADIATION DETECTION DEVICE, AND COMPUTER-READABLE MEDIUM

(71) Applicant: Fujifilm Corporation, Tokyo (JP)

(72) Inventor: Yasufumi Oda, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/944,456

(22) Filed: Jul. 17, 2013

(65) Prior Publication Data

US 2014/0021360 A1 Jan. 23, 2014

(30) Foreign Application Priority Data

Jul. 19, 2012 (JP) ................................ 2012-160846

(51) Int. Cl.
*G01T 1/20* (2006.01)

(52) U.S. Cl.
USPC ........................................................ 250/366

(58) Field of Classification Search
USPC ................ 250/366, 370.01–370.15; 378/98.8
See application file for complete search history.

(56) References Cited

U.S. PATENT DOCUMENTS 7,491,942 B2 * 2/2009 Black et al. ............... 250/370.07
2012/0201351 A1 * 8/2012 Iwakiri et al. .................. 378/62

FOREIGN PATENT DOCUMENTS

JP         2012026884 A  *  2/2012
WO     WO 03/000136 A1     1/2003

* cited by examiner

*Primary Examiner* — Kiho Kim
(74) *Attorney, Agent, or Firm* — Birch, Stewart, Kolasch & Birch, LLP

(57) ABSTRACT

A radiation detection device including a radiation detection unit, a profile information acquisition unit, a control condition determination unit and a controller. The radiation detection unit converts radiation irradiated from a radiation irradiation device to charges and accumulates the charges. The profile information acquisition unit acquires profile information representing a change per unit time of radiation amounts of the radiation irradiated from the radiation irradiation device. The control condition determination unit determines a control condition of the radiation detection unit on the basis of the profile information acquired by the profile information acquisition unit. The controller controls the radiation detection unit in accordance with the control condition determined by the control condition determination unit.

20 Claims, 11 Drawing Sheets

RADIATION DETECTION DEVICE, CONTROL METHOD FOR RADIATION DETECTION DEVICE, AND COMPUTER-READABLE MEDIUM

CROSS-REFERENCE TO RELATED APPLICATION

This application is based on and claims priority under 35 USC 119 from Japanese Patent Application No. 2012-160846 filed on Jul. 19, 2012, which is incorporated by reference herein.

BACKGROUND

1. Technical Field

The present invention relates to a radiation detection device, a control method for the radiation detection device, and a computer-readable medium.

2. Related Art

Heretofore, radiation image capture systems that capture radiation images for purposes of medical diagnostics have been known. Commonly, a radiation image capture system is constituted with a radiation irradiation device that irradiates radiation and a radiation image capture device that is equipped with a radiation detection device, which detects radiation that has been irradiated from the radiation irradiation device and passed through an imaging subject to capture a radiation image. The radiation image capture device captures the radiation image by reading charges that have been generated in accordance with the irradiated radiation and accumulated in the radiation detection device. In general, this radiation image capture device is equipped with sensor portions formed of elements such as photoelectric conversion elements, which generate electric charges in response to the irradiation of light into which the radiation is converted, and switching components that read out the charges generated at the sensor portions.

It is generally known that a rising profile—a duration from the start of an irradiation until a desired radiation amount is reached, an amount of change per unit time or the like—and a falling profile—a duration from the end of an irradiation until a desired radiation amount is reached, an amount of change per unit time or the like—differ depending on the kind of radiation irradiation device. For example, the rising profile and falling profile differ depending on whether the type of a radiation irradiation device is a single-phase transformer type or an inverter type or the like.

Accordingly, Patent Document 1 (Japanese National Re-Publication No. 2003/000136) recites a technology in which, when an X-ray image is to be read, a delay duration corresponding to a rise time of irradiated X-rays is specified.

The radiation image capture device described above may be equipped with a controller that acquires electronic signals corresponding to charges generated at the sensor portions and controls operations of the radiation detection device in accordance with control conditions. Control conditions are determined on the basis of changes with time (profiles) of radiation amounts of the irradiated radiation. However, as mentioned above, rising profiles and falling profiles differ with different types of radiation irradiation device and suchlike. Consequently, it may not be possible to appropriately detect the beginning or the end of an irradiation of radiation. Therefore, because of the differences between radiation irradiation devices, it may not be possible for the controller to suitably control a radiation detection unit.

The present invention has been made to solve the problem described above, and an object of the present invention is to provide a radiation detection device in which a radiation detection unit may be controlled in accordance with radiation irradiation devices, a control program for the radiation detection device and a control method for the radiation detection device.

SUMMARY

A radiation detection device in accordance with a first aspect of the present invention includes: a radiation detection unit that converts radiation irradiated from a radiation irradiation device to charges and accumulates the charges; a profile information acquisition unit that acquires profile information representing a change per unit time of radiation amounts of the radiation irradiated from the radiation irradiation device; a control condition determination unit that determines a control condition of the radiation detection unit on the basis of the profile information acquired by the profile information acquisition unit; and a controller that controls the radiation detection unit in accordance with the control condition determined by the control condition determination unit.

A computer-recordable medium in accordance with a second aspect of the present invention stores a program causing a computer to execute a process for controlling a radiation detection device, the process including: acquiring profile information representing a change per unit time of radiation amounts of radiation irradiated from a radiation irradiation device; determining a control condition of a radiation detection unit on the basis of the acquired profile information, the radiation detection unit converting radiation irradiated from the radiation irradiation device to charges and accumulating the charges; and controlling the radiation detection unit in accordance with the determined control condition.

A radiation detection device control method in accordance with a third aspect of the present invention includes: acquiring profile information representing a change per unit time of radiation amounts of radiation irradiated from a radiation irradiation device; determining a control condition of a radiation detection unit on the basis of the acquired profile information, the radiation detection unit converting radiation irradiated from the radiation irradiation device to charges and accumulating the charges; and controlling the radiation detection unit in accordance with the determined control condition.

BRIEF DESCRIPTION OF THE DRAWINGS

An exemplary embodiment of the present invention will be described in detail based on the following figures, wherein.

DETAILED DESCRIPTION

Herebelow, an example of a present exemplary embodiment is described with reference to the attached drawings.

Figure 1:
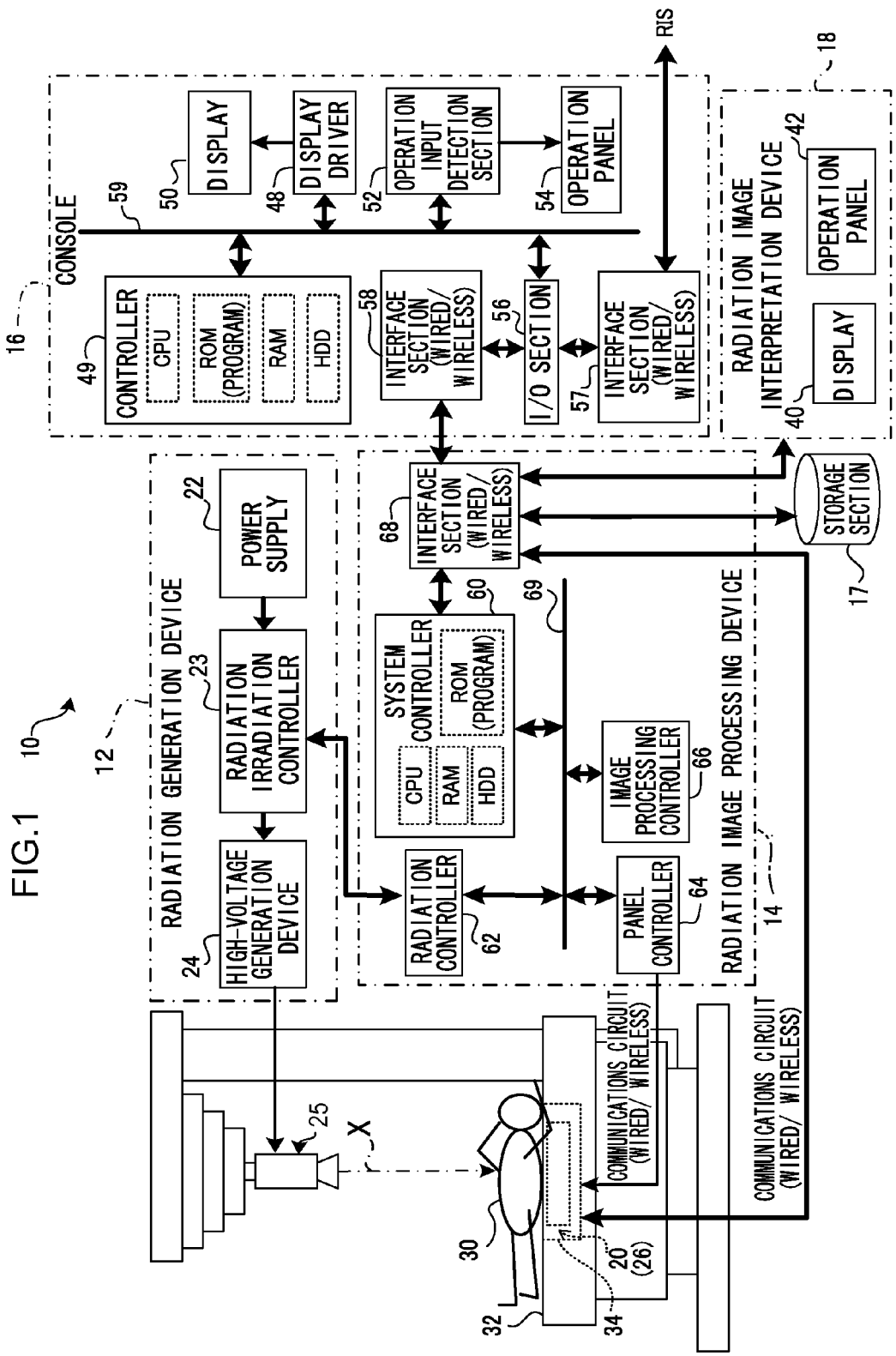
FIG. 1 is a schematic structural diagram showing an example of schematic structure of a radiation image capture system in accordance with a present exemplary embodiment.

First, the overall schematic structure of a radiation image capture system equipped with a radiation image processing device according to the present exemplary embodiment is described. FIG. 1 shows a schematic structural diagram of the schematics of the overall structure of an example of the radiation image capture system according to the present exemplary embodiment. A radiation image capture system 10 according to the present exemplary embodiment may capture radiation images that are video images and also still images. The meaning of the term "video image" as used in the present exemplary embodiment includes successive still images being rapidly displayed so as to be interpreted as moving images, in which a process of capturing a still image, converting it to electronic signals, transferring the electronic signals, and replaying the still image from the electronic signals is rapidly repeated. Thus, depending on the degree of "rapidity", imaging of (a portion or the whole of) the same region a plural number of times in a pre-specified duration and successively replaying the images, which is known as "frame advance", is also encompassed by the term "video image". In the radiation image capture system 10 according to the present exemplary embodiment, an electronic cassette 20 itself provides a function for detecting the start of an irradiation of radiation (the start of imaging).

The radiation image capture system 10 according to the present exemplary embodiment provides functions for capturing radiation images in response to operations by doctors, radiographers and the like on the basis of instructions (imaging menu selections) inputted from an external system (for example, a radiology information system (RIS)) via a console 16.

The radiation image capture system 10 according to the present exemplary embodiment also provides functions that enable doctors, radiographers and the like to interpret radiation images, by displaying captured radiation images at a display 50 of the console 16 or at a radiation image interpretation device 18 or the like.

The radiation image capture system 10 according to the present exemplary embodiment is equipped with a radiation generation device 12, a radiation image processing device 14, the console 16, a storage section 17, the radiation image interpretation device 18, and the electronic cassette 20.

The radiation generation device 12 is equipped with a power supply 22, a radiation controller 23 and a high-voltage generation device 24. The radiation controller 23 provides a function for causing an irradiation of radiation X from a radiation source 25, at an imaging target region of an imaging subject 30 on an imaging table 32, in accordance with control by a radiation controller 62 of the radiation image processing device 14. The radiation controller 23 according to the present exemplary embodiment supplies current supplied from the power supply 22 to the high-voltage generation device 24 and supplies a high voltage generated by the high-voltage generation device 24 to the radiation source 25, causing the radiation X to be generated. The power supply 22 may be either of an AC power source and a DC power source. The high-voltage generation device 24 may be any of a single-phase transformer type, a three-phase transformer type, an inverter type and a condenser type. FIG. 1 shows the radiation generation device 12 as being in a fitted form, but this is not limiting and the radiation generation device 12 may be in a mobile form.

Radiation X that passes through the imaging subject 30 is irradiated onto the electronic cassette 20, which is retained at a retention portion 34 inside the imaging table 32. In accordance with radiation amounts of the radiation X passing through the imaging subject 30, the electronic cassette 20 generates electric charges, and provides functions for generating image information representing a radiation image based on the generated charge amounts and outputting the image information. The electronic cassette 20 according to the present exemplary embodiment is equipped with a radiation detection device 26. The meaning of the term "radiation amounts" as used in the present exemplary embodiment includes radiation intensities and means, for example, the radiation that is irradiated per unit time given a predetermined X-ray tube voltage and a predetermined X-ray tube current.

In the present exemplary embodiment, the image information representing a radiation image that is outputted by the electronic cassette 20 is inputted to the console 16 via the radiation image processing device 14. The console 16 according to the present exemplary embodiment provides functions for controlling the radiation generation device 12 and the electronic cassette 20, using imaging menu selections and various other kinds of information acquired from the external system (the RIS) or the like via a wireless network (a local area network (LAN)) or the like. The console 16 according to the present exemplary embodiment also provides functions for exchanging various kinds of information such as image information of radiation images with the radiation image processing device 14, and functions for exchanging various kinds of information with the electronic cassette 20.

The console 16 according to the present exemplary embodiment is constituted as a server computer, and is equipped with a controller 49, a display driver 48, the display 50, an operation input detection section 52, an operation panel 54, an input/output section 56, an interface section 57 and an interface section 58.

The controller 49 provides functions for controlling overall operations of the console 16, and is provided with a central processing unit (CPU), ROM, RAM and a hard disk drive (HDD). The CPU provides functions for controlling overall operations of the console 16. Various programs including a control program to be used at the CPU and suchlike are pre-memorized in the ROM. The RAM provides functions for temporarily memorizing various kinds of data. The HDD provides functions for memorizing and retaining various kinds of data.

The display driver 48 provides functions for controlling the display of various kinds of information at the display 50. The display 50 according to the present exemplary embodiment provides functions for displaying imaging menu items, captured radiation images and the like. The operation input detection section 52 provides functions for detecting operation states of the operation panel 54. The operation panel 54 is for doctors, radiographers and the like to input operation instructions in relation to the imaging of radiation images. The operation panel 54 according to the present exemplary embodiment includes, for example, a touch panel, a touch pen, plural buttons and a mouse, or the like. In a case in which the operation panel 54 is structured as a touch panel, it may be the same structure as the display 50.

The input/output section 56 and the interface section 58 exchange various kinds of information with the radiation image processing device 14 and the high-voltage generation device 24 by wireless communications, and provide functions for exchanging various kinds of information such as image information with the electronic cassette 20. The interface section 57 provides functions for exchanging various kinds of information with the RIS.

The controller 49, the display driver 48, the operation input detection section 52, and the input/output section 56 are connected to be able to transfer information and the like to one another by a bus 59, which is a system bus, a control bus or the like. Therefore, the controller 49 may control displays of various kinds of information at the display 50 via the display driver 48, and may control exchanges of various kinds of information with the radiation generation device 12 and the electronic cassette 20 via the interface section 58.

The radiation image processing device 14 according to the present exemplary embodiment provides functions for controlling the radiation generation device 12 and the electronic cassette 20 in accordance with instructions from the console 16. The radiation image processing device 14 also provides functions for memorizing radiation images received from the electronic cassette 20 in the storage section 17 and for controlling displays at the display 50 of the console 16 and/or the radiation image interpretation device 18.

The radiation image processing device 14 according to the present exemplary embodiment is provided with a system controller 60, the radiation controller 62, a panel controller 64, an image processing controller 66 and an interface section 68.

The system controller 60 provides functions for overall control of the radiation image processing device 14 and functions for controlling the radiation image capture system 10. The system controller 60 is provided with a CPU, ROM, RAM and an HDD. The CPU provides functions for controlling operations of the radiation image processing device 14 as a whole and the radiation image capture system 10. Various programs such as a control program to be used at the CPU and suchlike are pre-memorized in the ROM. The RAM provides functions for temporarily storing various kinds of data. The HDD provides functions for storing and retaining various kinds of data. The radiation controller 62 provides functions for controlling the radiation controller 23 of the radiation generation device 12 in accordance with instructions from the console 16 and suchlike. The panel controller 64 provides functions for controlling the electronic cassette 20 on the basis of instructions from the console 16 and suchlike. The image processing controller 66 provides functions for applying various kinds of image processing to radiation images.

The system controller 60, the radiation controller 62, the panel controller 64 and the image processing controller 66 are connected to be capable of transferring information and the like to one another by a bus 69, which is a system bus, a control bus or the like.

The storage section 17 according to the present exemplary embodiment provides functions for memorizing captured radiation images and information relating to the radiation images. The storage section 17 may be, for example, an HDD or the like.

The radiation image interpretation device 18 according to the present exemplary embodiment provides functions for interpretation of the captured radiation images by radiographic interpretation staff. The radiation image interpretation device 18 is not particularly limited but may be a "radiographic interpretation viewer" or a console or the like. The radiation image interpretation device 18 according to the present exemplary embodiment is constituted as a personal computer and, similarly to the console 16 and the radiation image processing device 14, is provided with a CPU, ROM, RAM, an HDD, a display driver, a display 40, an operation input detection section, an operation panel 42, an input/output section, and an interface section. In FIG. 1, to avoid complexity in the drawing, only the display 40 and the operation panel 42 are shown of these structures; the other structures are not shown.

Figure 2:
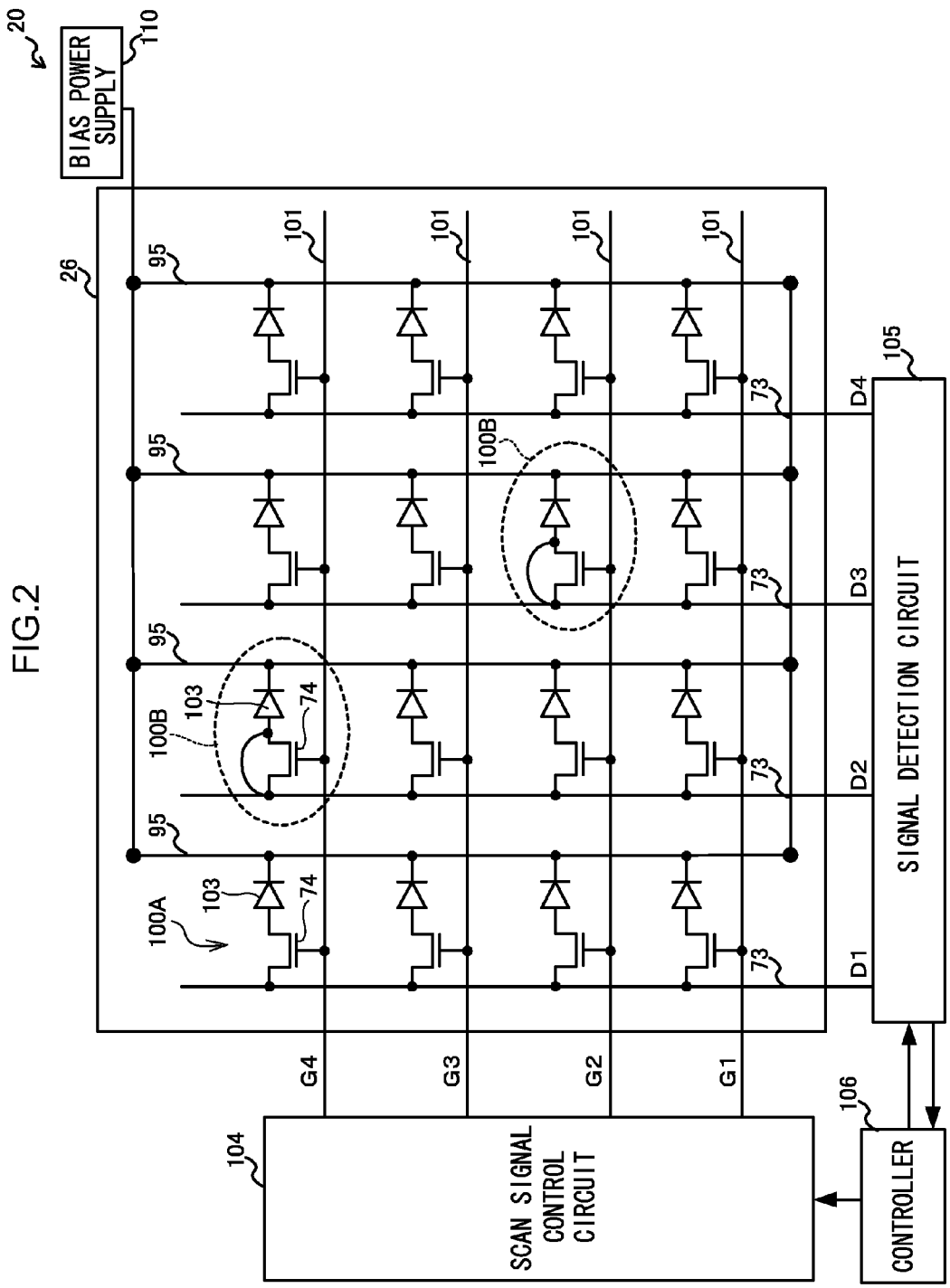
FIG. 2 is a structural diagram showing an example of overall structure of an electronic cassette in accordance with the present exemplary embodiment.

Next, general structure of the electronic cassette 20 according to the present exemplary embodiment is described. FIG. 2 shows an example of schematic structure of the electronic cassette 20 in accordance with the present exemplary embodiment. In the present exemplary embodiment, a case is described in which the present invention is applied to a radiation detection device 26 of an indirect conversion type, which temporarily converts radiation such as X-rays to light and then converts the converted light to electric charges. In the present exemplary embodiment, the electronic cassette 20 is equipped with the indirect conversion-type radiation detection device 26. Note that a scintillator for converting radiation to light is not shown in FIG. 2.

In the radiation detection device 26, a plural number of pixels 100 are arranged in a matrix pattern. Each pixel 100 includes a sensor portion 103 and a TFT switch 74. The sensor portion 103 senses light and generates charges, and accumulates the generated charges. The TFT switch 74 is a switching element for reading out the charges accumulated in the sensor portion 103. In the present exemplary embodiment, the sensor portion 103 generates charges when irradiated with the light to which the radiation is converted by the scintillator.

The pixels 100 are plurally arranged in the matrix in one direction (the direction of the gate lines in FIG. 2) and a direction intersecting the gate line direction (the direction of the signal lines in FIG. 2). In FIG. 2, the arrangement of the pixels 100 is shown simplified; for example, the pixels 100 are arranged 1024 in the gate line direction by 1024 in the signal line direction.

In the present exemplary embodiment, among the plural pixels 100, pixels for radiation image capture 100A and pixels for radiation detection 100B are specified in advance. In FIG. 2, the radiation detection pixels 100B are encircled by broken lines. The radiation image capture pixels 100A are used for detecting the radiation X and generating an image represented by the radiation X. The radiation detection pixels 100B (which are described in detail below) are used to detect the radiation X in order to detect the start of an irradiation of the radiation X and the like. The radiation detection pixels 100B output charges during a charge accumulation period without regard to the TFT switches 74 being switched on or off.

Figure 3:
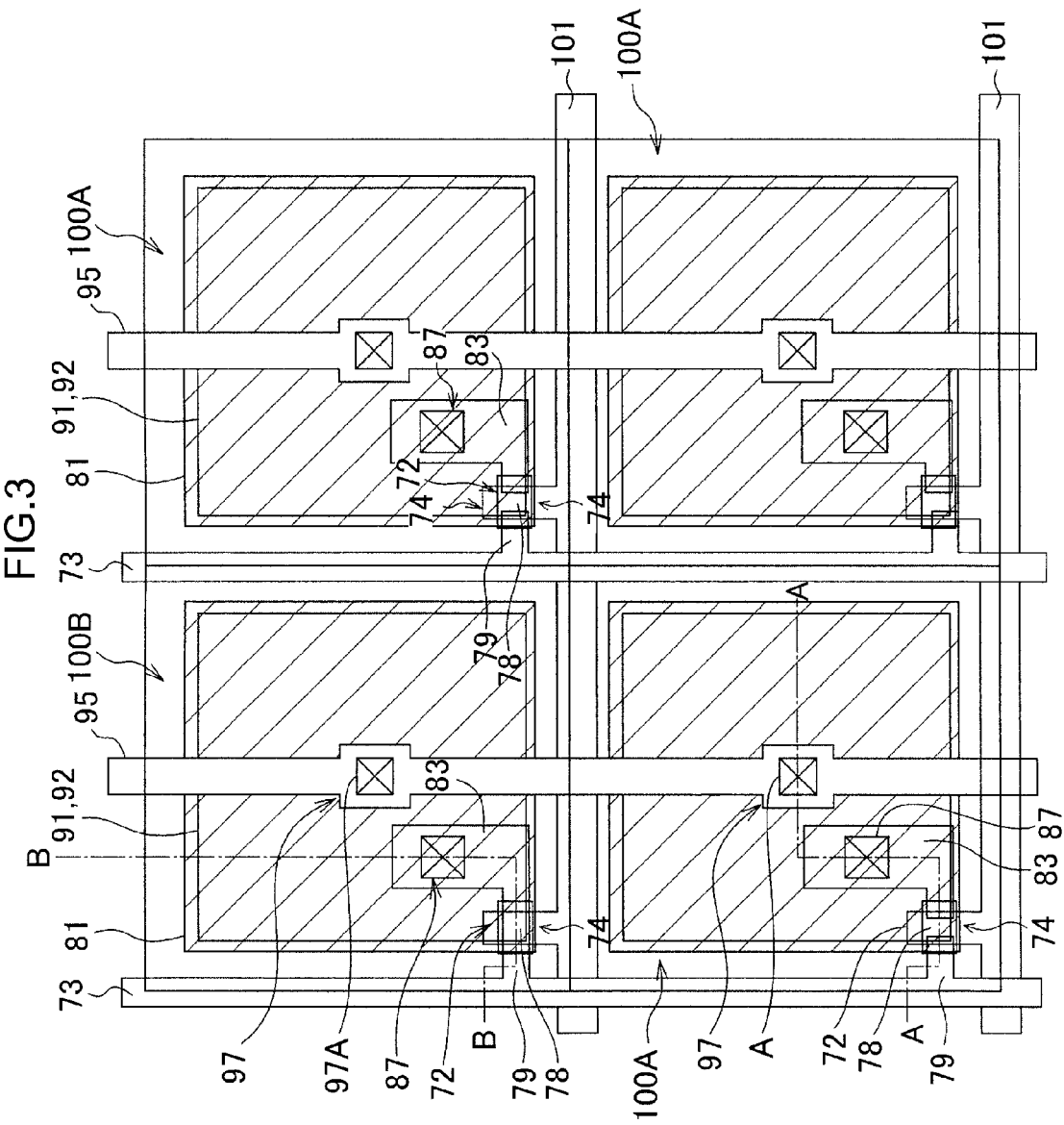
FIG. 3 is a plan diagram showing an example of structure of a radiation detection device in accordance with the present exemplary embodiment.

In the radiation detection device 26, plural gate lines 101 and plural signal lines 73 are disposed orthogonally to one another on a substrate 71 (see FIG. 3). The gate lines 101 are for turning the TFT switches 74 on and off. The signal lines 73 are for reading out the charges accumulated in the sensor portions 103. In the present exemplary embodiment, one of the signal lines 73 is provided for each pixel row in the one direction, and one of the gate lines 101 is provided for each pixel row in the intersecting direction. For example, in the case in which 1024 by 1024 of the pixels 100 are arranged in the gate line direction and the signal line direction, 1024 each of the signal lines 73 and of the gate lines 101 are provided.

In the radiation detection device 26, common electrode lines 95 are arranged in parallel with the signal lines 73. One ends and other ends of the common electrode lines 95 are connected in parallel, and a bias power supply 110 that supplies a predetermined bias voltage is connected to the one ends. The sensor portions 103 are connected to the common electrode lines 95, and the bias voltage is applied via the common electrode lines 95.

Scan signals for switching the TFT switches 74 flow through the gate lines 101. The TFT switches 74 are switched by these scan signals flowing in the gate lines 101.

In accordance with the switching states of the TFT switches 74 of the pixels 100, electronic signals corresponding to the charges accumulated in the pixels 100 flow in the signal lines 73. More specifically, when the TFT switch 74 of any of the pixels 100 connected to a signal line 73 is turned on, an electronic signal corresponding to the charge amount accumulated in that pixel 100 flows in that signal line 73.

A signal detection circuit 105 that detects the electronic signals flowing out through the signal lines 73 is connected to the signal lines 73. A scan signal control circuit 104 that outputs scan signals to the gate lines 101 for turning the TFT switches 74 on and off is connected to the gate lines 101. FIG. 2 is simplified to show a single signal detection circuit 105 and scan signal control circuit 104. However, for example, the signal detection circuit 105 and the scan signal control circuit 104 may be plurally provided and a predetermined number (for example, 256) of the signal lines 73 or the gate lines 101 connected to each signal detection circuit 105 or scan signal control circuit 104. For example, in the case in which 1024 each of the signal lines 73 and the gate lines 101 are provided, four of the scan signal control circuit 104 are provided and each connected to 256 of the gate lines 101 and four of the signal detection circuit 105 are provided and each connected to 256 of the signal lines 73.

Figure 6:
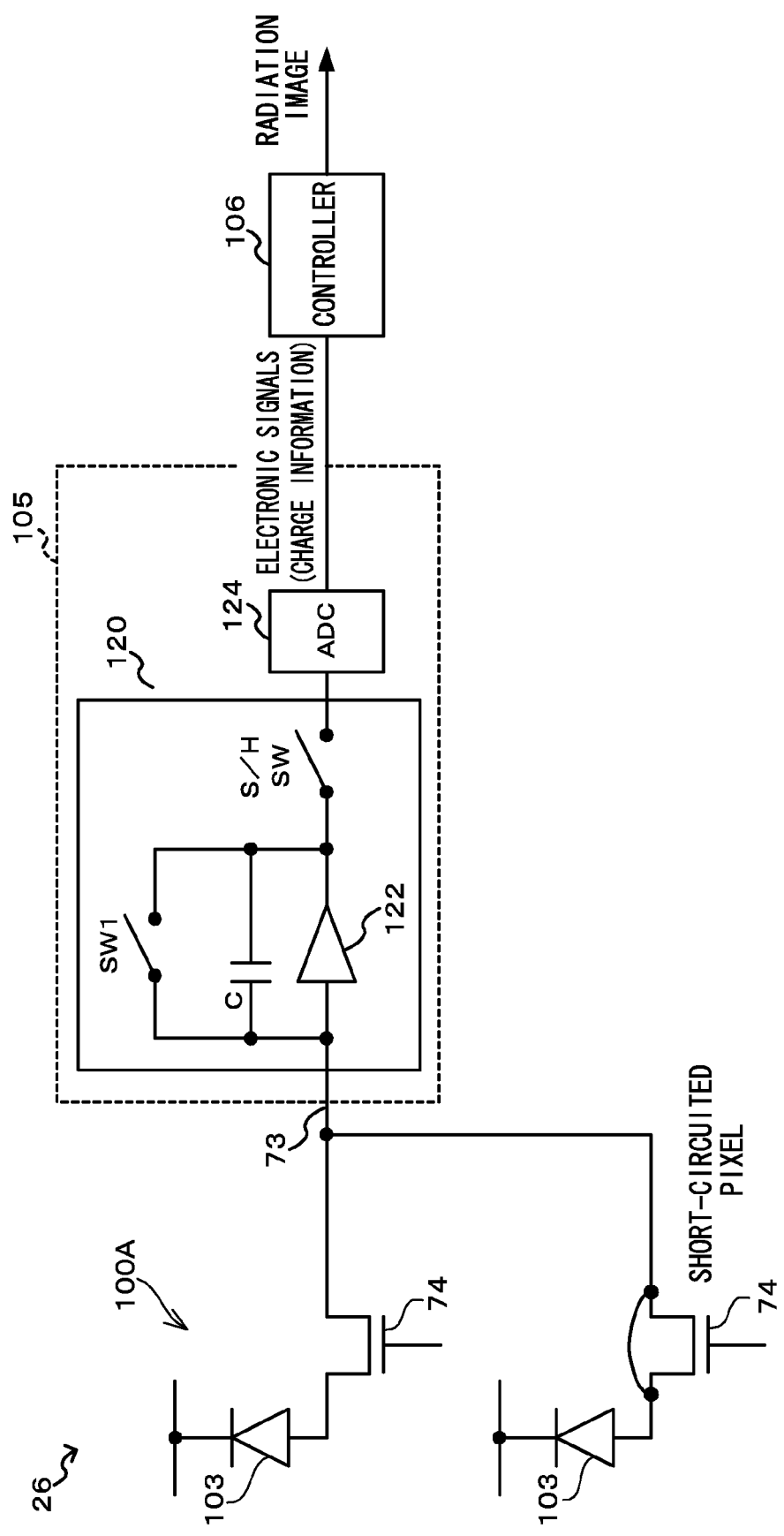
FIG. 6 is a schematic structural diagram showing an example of schematic structure of a signal detection circuit of the radiation detection device in accordance with the present exemplary embodiment.

For each signal line 73, the signal detection circuit 105 incorporates an amplification circuit that amplifies the inputted electronic signals (see FIG. 6). In the signal detection circuit 105, the electronic signals inputted from the signal lines 73 are amplified by the amplification circuits and converted to digital signals by an analog/digital converter (ADC) (described in detail below).

A controller 106 is connected to the signal detection circuit 105 and the scan signal control circuit 104. The controller 106 applies predetermined processing such as noise removal and the like to the digital signals converted at the signal detection circuit 105, outputs control signals indicating signal detection timings to the signal detection circuit 105, and outputs control signals indicating scan signal output timings to the scan signal control circuit 104.

The controller 106 according to the present exemplary embodiment is constituted by a microcomputer, which is provided with a CPU, ROM and RAM, and a non-volatile storage section formed with flash memory or the like. The controller 106 executes a program memorized in the RAM at the CPU, and carries out control for capturing a radiation image. The controller 106 applies processing to interpolate image data for the radiation detection pixels 100B (interpolation processing) to the image data to which the above-mentioned predetermined processing has been applied, to generate an image representing the irradiated radiation X. That is, the controller 106 generates the image represented by the irradiated radiation X by interpolating image data for the radiation detection pixels 100B on the basis of the image data that has been subjected to the above predetermined processing.

Figure 4:
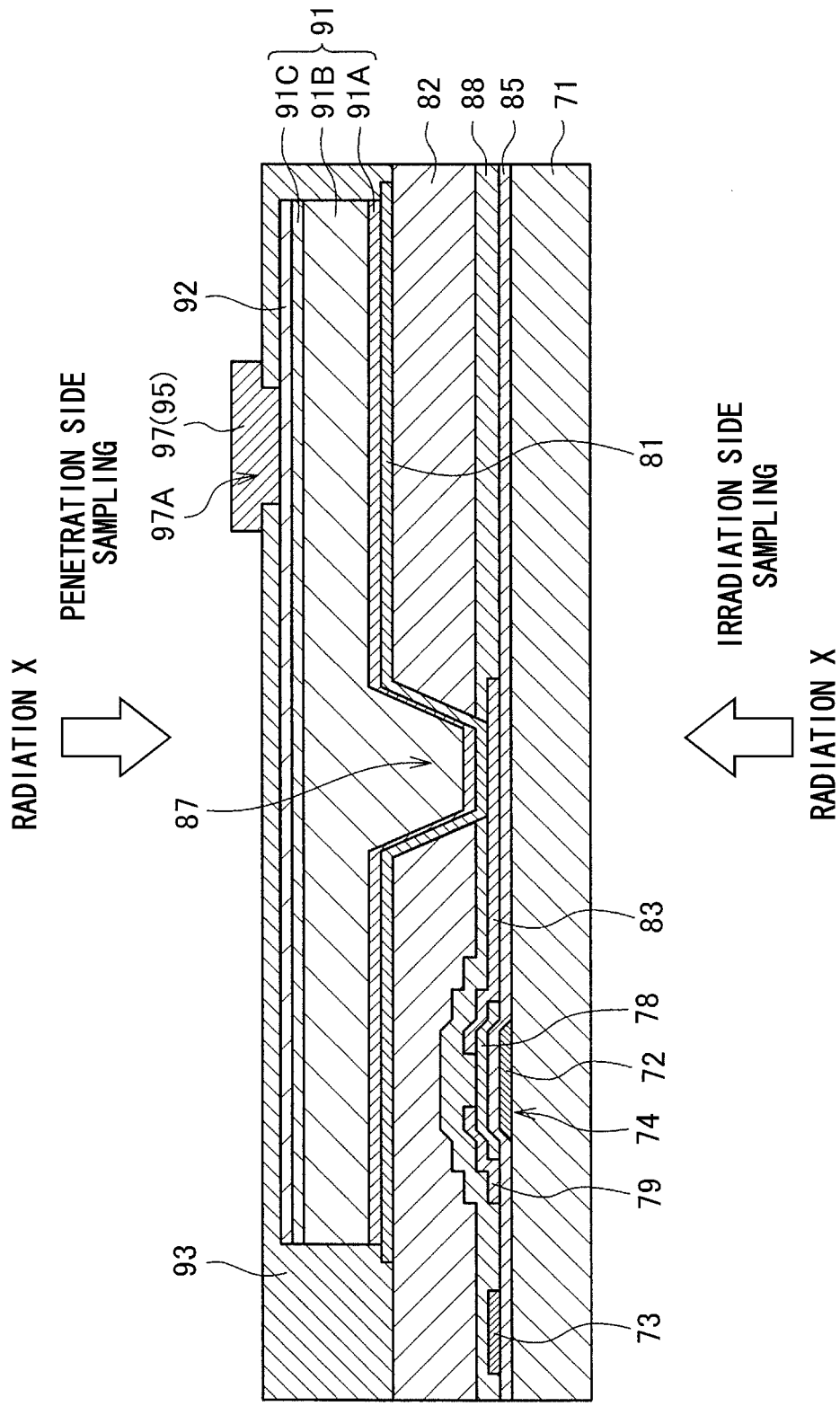
FIG. 4 is a linear sectional diagram of an example of the radiation detection device in accordance with the present exemplary embodiment.
Figure 5:
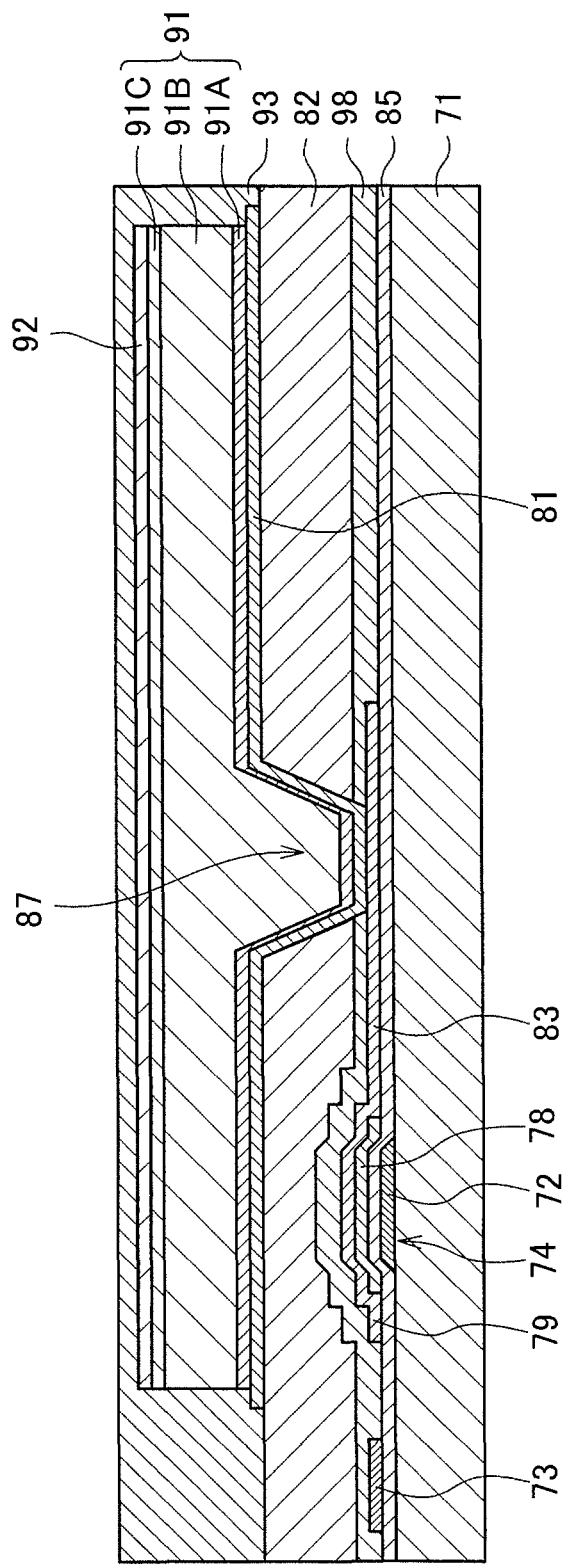
FIG. 5 is a linear sectional diagram of the example of the radiation detection device in accordance with the present exemplary embodiment.

FIG. 3 shows a plan diagram illustrating structures of the indirect conversion-type radiation detection device 26 according to the present exemplary embodiment. FIG. 4 shows a sectional diagram of a radiation image capture pixel 100A taken along line A-A in FIG. 3, and FIG. 5 shows a sectional diagram of a radiation detection pixel 100B taken along line B-B in FIG. 3.

As shown in FIG. 4, in each radiation image capture pixel 100A of the radiation detection device 26, the gate line 101 (see FIG. 3) and a gate electrode 72 are formed on the substrate 71, which is formed of non-alkaline glass or the like, and the gate line 101 is connected with the gate electrode 72 (see FIG. 3). A wiring layer in which the gate line 101 and the gate electrode 72 are formed (hereinafter, this wiring layer is referred to as "the first signal wiring layer") is formed using aluminium or copper, or a layered film whose principal constituent is aluminium or copper, but is not limited to these.

An insulation layer 85 is formed over the whole area of the first signal wiring layer. A portion of the insulation layer 85 that is disposed over the respective gate electrode 72 is employed as a gate insulation layer of the TFT switch 74. The insulation layer 85 is formed of, for example, SiNx or the like, and is formed by, for example chemical vapor deposition (CVD) film formation.

A semiconductor active layer 78 is formed on the insulation layer 85 in a pattern of islands over the gate electrodes 72. The semiconductor active layer 78 is the channel portion of each TFT switch 74. The semiconductor active layer 78 is formed of, for example, a film of amorphous silicon.

Source electrodes 79 and drain electrodes 83 are formed in a layer thereabove. The signal lines 73 are formed together with the source electrodes 79 and the drain electrodes 83 in a wiring layer in which the source electrodes 79 and the drain electrodes 83 are formed. The source electrodes 79 are connected to the signal lines 73 (see FIG. 3). The wiring layer in which the source electrodes 79, drain electrodes 83 and signal lines 73 are formed (hereinafter this wiring layer is referred to as "the second signal wiring layer") is formed using aluminium or copper, or a layered film whose principal constituent is aluminium or copper, but is not limited to these. A doped semiconductor layer (not shown in the drawings), of amorphous silicon doped with impurities or the like, is formed between the source electrodes 79 and drain electrodes 83 and the semiconductor active layer 78. The TFT switches 74 for switching are structured by these parts. Note that the source electrode 79 and the drain electrode 83 may be exchanged depending on the polarity of the charges to be collected and accumulated by a lower electrode 81 of the TFT switch 74, which is described below.

A TFT protection layer 98 is formed to cover the second signal wiring layer over substantially the whole area of a region of the substrate 71 in which the pixels 100 are provided (substantially the whole of the substrate 71). The TFT protection layer 98 is for protecting the TFT switches 74 and signal lines 73 and the like. The TFT protection layer 98 is formed of, for example, SiNx or the like, and is formed by, for example, CVD film formation.

An interlayer insulation film 82 is formed as a coating on the TFT protection layer 98. This interlayer insulation film 82 is formed with a film thickness of 1 to 4 μm of a photosensitive organic material with low permittivity (relative permittivity εr=2 to 4) (for example, a positive-type photosensitive acrylic resin such as a material in which a naphthoquinone diazide-based positive-type photosensitivizer is mixed into a base polymer formed of a copolymer of methacrylic acid and glycidyl methacrylate, or the like).

In the radiation detection device 26 according to the present exemplary embodiment, a capacitance between metals disposed in a layer above and the layer below the interlayer insulation film 82 is kept low by the interlayer insulation film 82. In addition, this kind of material generally functions as a flattening film, and provides an effect of flattening steps in the layers therebelow. In the radiation detection device 26 according to the present exemplary embodiment, contact holes 87 are formed at positions of the interlayer insulation film 82 and the TFT protection layer 98 that oppose the drain electrodes 83.

The lower electrodes 81 of the sensor portions 103 are formed on the interlayer insulating film 82 so as to cover the pixel regions and fill in the contact holes 87, and the lower electrodes 81 are connected with the drain electrodes 83 of the TFT switches 74. If semiconductor layers 91, which are described below, have a thickness of around 1 μm, the material of the lower electrodes 81 is hardly at all limited provided the lower electrodes 81 are conductive. Therefore, there is no problem provided the lower electrodes 81 are formed using a conductive metal such as an aluminium-based material, ITO or the like.

If the film thickness of the semiconductor layers 91 is small (around 0.2-0.5 μm), light is insufficiently absorbed by the semiconductor layers 91. Therefore, in order to prevent an increase in leakage currents caused by illumination of light onto the TFT switches 74, it is preferable if the semiconductor layers 91 are an alloy or layered film with a light-blocking metal as a principal constituent thereof.

The semiconductor layers 91, which function as photodiodes, are formed on the lower electrodes 81. In the present exemplary embodiment, PIN-architecture photodiodes, in which an n+ layer, an i layer and a p+ layer are layered (n+ amorphous silicon, amorphous silicon, and p+ amorphous silicon), are employed as the semiconductor layers 91. The semiconductor layers 91 are formed by an n+ layer 21A, an i layer 21B and a p+ layer 21C being layered in this order from the lowest layer. The i layer 21B generates charges (pairs of free electrons and free holes) when illuminated with light. The n+ layer 21A and the p+ layer 21C function as contact layers and electronically connect the lower electrodes 81 and upper electrodes 92, which are described below, with the i layer 21B.

The upper electrodes 92 are respectively individually formed over the semiconductor layers 91. A material with high light transmissivity such as, for example, ITO, IZO (indium zinc oxide) or the like is used for the upper electrodes 92. In the radiation detection device 26 according to the present exemplary embodiment, each sensor portion 103 includes the upper electrode 92, the semiconductor layers 91 and the lower electrode 81.

A coating-form interlayer insulation film 93 is formed over the interlayer insulation film 82, the semiconductor layers 91 and the upper electrodes 92, so as to cover the semiconductor layers 91 with openings 97A being formed at portions that correspond with the upper electrodes 92.

The common electrode lines 95 are formed over the interlayer insulation film 93, of aluminium, copper, or an alloy or layered film with aluminium or copper as a principal constituent. Contact pads 97 are formed on the common electrode lines 95 near the openings 97A. The contact pads 97 are electronically connected with the upper electrodes 92 through the openings 97A in the interlayer insulation film 93.

In contrast, at each radiation detection pixel 100B of the radiation detection device 26, as shown in FIG. 5, the TFT switch 74 is formed such that the source electrode 79 and the drain electrode 83 are in contact. That is, in the pixel 100B, the source and drain of the TFT switch 74 are short-circuited. Therefore, charges collected at the lower electrode 81 of the pixel 100B flow into the signal line 73 regardless of the switching state of the TFT switch 74.

A scintillator, which is a radiation conversion layer, is provided on the radiation detection device 26 that is formed in this manner. If required, a protective film is formed of an insulating material with low light absorption, and the scintillator is adhered to the surface thereof using an adhesive resin with low light absorption. The scintillator may also be formed by vacuum vapor deposition. It is desirable if the scintillator generates fluorescent light with a relatively wide wavelength range, such that light in a wavelength range that can be absorbed is produced. This kind of scintillator may include CsI:Na, CaWO$_4$, YTaO$_4$:Nb, BaFX:Eu (in which X is Br or Cl), LaOBr:Tm, GOS or the like. Specifically, in a case in which X-rays are used as the radiation X and imaged, it is preferable to include cesium iodide (CsI). It is particularly preferable to use cesium iodide with thallium added thereto (CsI(Tl)), which has a light emission spectrum with a wavelength range of 400 nm to 700 nm when X-rays are irradiated thereon. CsI:Tl has a light emission peak wavelength of 565 nm, in the visible light region. If a scintillator containing CsI is to be used, it is preferable to use a scintillator that is formed in a strip-shaped columnar crystal structure by vacuum vapor deposition.

In a case in which, as shown in FIG. 4, the radiation X is irradiated from the side of the radiation detection device 26 at which the semiconductor layers 91 are formed and the radiation detection device 26 acquires the radiation image with the TFT substrate that is provided at a rear face side relative to the face at which the radiation X is incident, which is referred to as penetration side sampling (PSS), light is more strongly emitted from the side of the scintillator provided at the semiconductor layers 91 that is at the upper face side in FIG. 4. In a case in which the radiation X is irradiated from the side of the radiation detection device 26 at which the TFT substrate is formed and the radiation detection device 26 acquires the radiation image with the TFT substrate that is provided at a front face side relative to the face at which the radiation X is incident, which is referred to as irradiation side sampling (ISS), radiation X that has passed through the TFT substrate is incident on the scintillator and light is more strongly emitted from the side of the scintillator at which the TFT substrate is disposed. Charges are produced by the light emitted from the scintillator to the sensor portions 103 of the pixels 100 provided at the TFT substrate. Therefore, in a case in which the radiation detection device 26 is of an ISS type, light emission positions of the scintillator are closer to the TFT substrate than in a case in which the radiation detection device 26 is of a PSS type. As a result, the resolution of the radiation images obtained by imaging is higher.

The radiation detection device 26 is not limited to the structures shown in FIG. 3 to FIG. 5; various modifications are possible. For example, in a case of penetration side sampling, probabilities of the radiation X reaching the radiation detection device 26 are lower. Therefore, instead of the structure described above, another imaging component such as a complementary metal oxide semiconductor (CMOS) image sensor or the like with low resistance to the radiation X may be combined with the TFTs. Further, a charge-coupled device (CCD) image sensor that shifts charges in accordance with shift pulses corresponding to the TFT scan signals may be substituted.

As another example, a flexible substrate may be used. Ultra-thin plate glass formed by a recently developed float process may be used as a base material for a flexible substrate, and is preferable in terms of improving transmissivity of the radiation X. An ultrathin plate glass that may be used in this case is disclosed in, for example, "Successful development of the world's thinnest ultra-thin plate glass, 0.1 mm thick, by a float process", Asahi Glass Co., Ltd. (online: accessed Aug. 20, 2011, URL: http://www.agc.com/news/2011/0516.pdf).

Now, schematic structure of the signal detection circuit 105 according to the present exemplary embodiment is described. FIG. 6 is a schematic structural diagram of an example of the signal detection circuit 105 in accordance with the present exemplary embodiment. The signal detection circuit 105 of the present exemplary embodiment is equipped with amplification circuits 120 and an analog/digital converter (ADC) 124. Although not shown in FIG. 6, the amplification circuits 120 are provided one for each of the signal lines 73. That is, the signal detection circuit 105 is equipped with plural amplification circuits 120 in the same number as the number of signal lines 73 in the radiation detection device 26.

Each amplification circuit 120 is structured as a charge amplification circuit and is provided with an amplifier 122, such as an operational amplifier or the like, a capacitor C that is connected in parallel with the amplifier 122, and a switch for charge resetting SW1 that is connected in parallel with the amplifier 122.

When the switch for charge resetting SW1 of the amplification circuit 120 is in the off state, charges (electronic signals) are read from the TFT switch 74 of a pixel 100, the charges read from the TFT switch 74 are accumulated at the capacitor C, and a voltage value outputted from the amplifier 122 is amplified in accordance with the accumulated charge amount.

The controller 106 applies charge reset signals to the switches for charge resetting SW1 and performs control to turn the switches for charge resetting SW1 on and off. When a switch for charge resetting SW1 is in the on state, the input side and output side of that amplifier 122 are short-circuited, and charge is discharged from the capacitor C.

The ADC 124 provides a function for converting electronic signals that are analog signals inputted from the amplification circuits 120 to digital signals, when sample-and-hold (S/H) switches SW are in the on state. The ADC 124 sequentially outputs the electronic signals that have been converted to digital signals to the controller 106.

The electronic signals outputted from all the amplification circuits 120 provided in the signal detection circuit 105 are inputted to the ADC 124 according to the present exemplary embodiment. That is, the signal detection circuit 105 according to the present exemplary embodiment is equipped with a single ADC 124 regardless of the number of amplification circuits 120 (and signal lines 73).

The present exemplary embodiment is structured so as to carry out detections in relation to irradiations of the radiation X without needing control signals from outside (for example, from the radiation image processing device 14). In the present exemplary embodiment, electronic signals (charge information) from the signal lines 73 to which the radiation detection pixels 100B are connected (in the case shown in FIG. 2, one or both of D2 and D3, for example, D2) are detected by the amplification circuits 120 of the signal detection circuit 105 and converted to digital signals. In the present exemplary embodiment, the controller 106 acquires the digital signals converted by the signal detection circuit 105 and, in accordance with specified parameters, detects irradiation starts and irradiation ends. The meaning of the term "detection" of electronic signals as used in the present exemplary embodiment includes sampling of the electronic signals.

Figure 7:
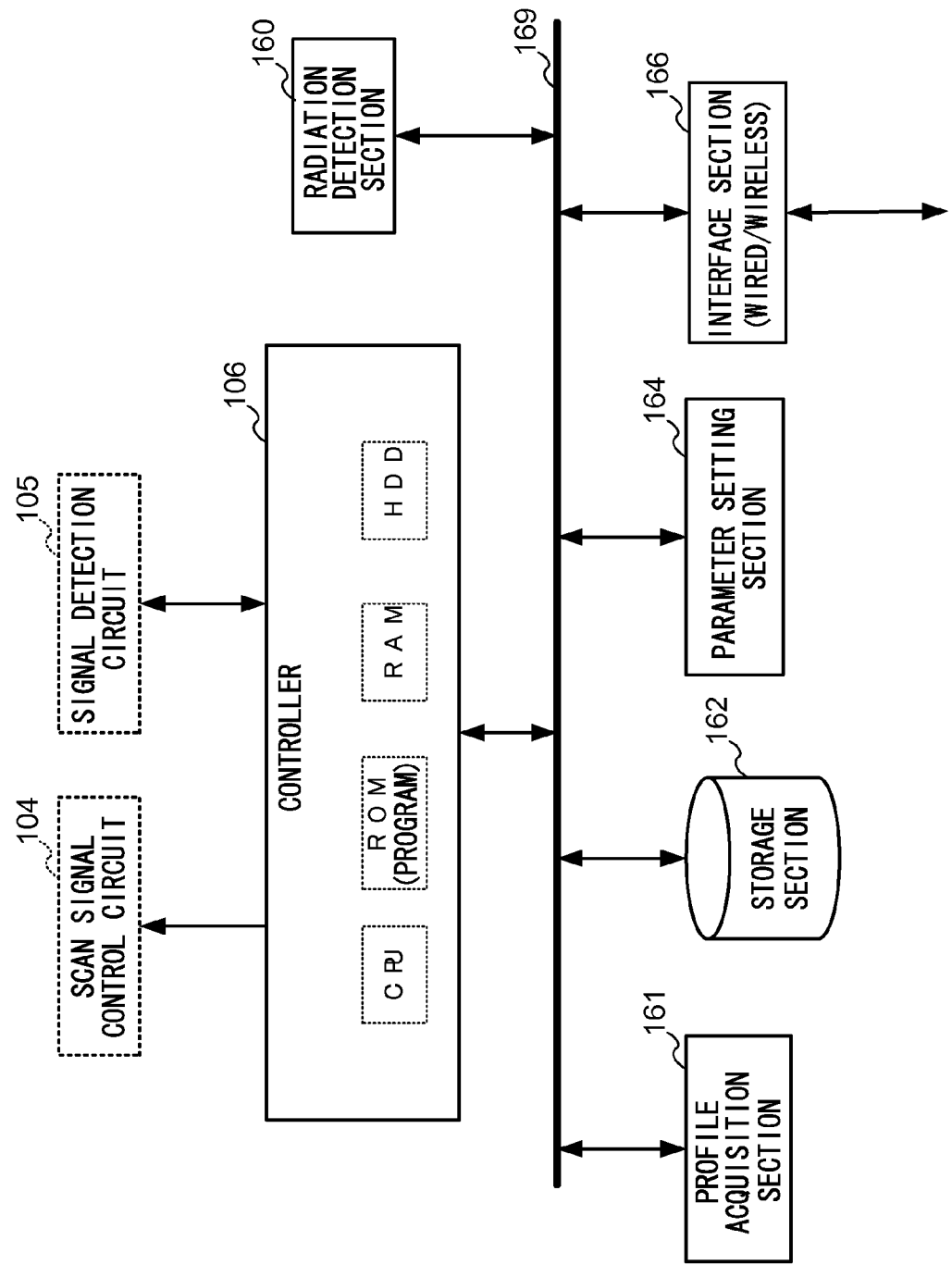
FIG. 7 is a functional block diagram showing an example of the structure of the electronic cassette in accordance with the present exemplary embodiment.

FIG. 7 is a functional block diagram of an example of structures corresponding to the functions of the controller 106 of the electronic cassette 20 in accordance with the present exemplary embodiment.

The controller 106 is provided with a CPU, ROM, RAM and an HDD. The CPU provides functions for controlling overall operations of the electronic cassette 20. Various programs that are used at the CPU are pre-memorized in the ROM. The RAM provides functions for temporarily storing various kinds of data. The HDD provides functions for storing and retaining various kinds of data. The controller 106 according to the present exemplary embodiment provides functions for acquiring, as control conditions, a start detection parameter that is used when detecting for the start of an irradiation of the radiation X from a radiation detection section 160 and an end detection parameter that is used when detecting for the end of an irradiation, and setting these control parameters at a parameter setting section 164.

The radiation detection section 160 provides functions for acquiring electronic signals (charge information) outputted from the radiation detection pixels 100B and detecting for the start of an irradiation of radiation in accordance with the start detection parameter set at the parameter setting section 164. The radiation detection section 160 further provides a function that detects for the end of an irradiation of radiation in accordance with the end detection parameter set at the parameter setting section 164.

A profile acquisition section 161 provides a function for, in accordance with control by the controller 106, acquiring a profile of the rise of the irradiated radiation (changes over time of radiation amounts until a predetermined radiation amount is reached that are to be regarded as the start of an irradiation of the radiation X). The profile acquisition section 161 also provides a function for, in accordance with control by the controller 106, acquiring a profile of the fall (changes over time of radiation amounts until a predetermined radiation amount is reached that are to be regarded as the end of an irradiation of the radiation X).

A storage section 162 provides functions for storing the rising profile and falling profile acquired by the profile acquisition section 161, or a start detection parameter generated on the basis of the rising profile and an end protection parameter generated on the basis of the falling profile.

The parameter setting section 164 provides a control condition determination function, which generates (determines) from the rising profile a start detection parameter that is to be used for detecting the start of an irradiation of the radiation X from the radiation detection section 160 when a radiation image is to be imaged, and a threshold setting function for setting the generated (determined) start detection parameter. Similarly, the parameter setting section 164 provides a control condition determination function that generates (determines) from the falling profile an end detection parameter that is to be used for detecting the end of an irradiation of the radiation X from the radiation detection section 160 and a threshold setting function for setting the generated (determined) end detection parameter.

The interface section 166 provides functions for exchanging various kinds of information, including menu items, image information of radiation images and the like, with the radiation image processing device 14, the console 16 and suchlike by wireless communications or wired communications.

The controller 106, the radiation detection section 160, the profile acquisition section 161, the storage section 162, the parameter setting section 164 and the interface section 166 are connected to be capable of exchanging information and the like with one another by a bus 169, which is a system bus, a control bus or the like.

Now, the acquisition of rising profile information and the acquisition of falling profile information in accordance with the present exemplary embodiment are described.

In the radiation image capture system 10 according to the present exemplary embodiment, as mentioned above, the electronic cassette 20 itself detects for the start of an irradiation of the radiation X, and when the irradiation start is detected, the electronic cassette 20 accumulates charges in accordance with irradiated radiation amounts of the radiation X. The electronic cassette 20 itself then detects for the end of the irradiation of the radiation X, and when the radiation end is detected, the electronic cassette 20 stops the accumulation of charges, reads out the accumulated charges and generates a radiation image. Thus, the electronic cassette 20 captures a radiation image. The electronic cassette 20 according to the present exemplary embodiments detects an irradiation start and irradiation end of the radiation X on the basis of electronic signals (charge information) outputted from the radiation detection pixels 100B. When this is being done, because of differences in the profiles (time changes) of the radiation X irradiated onto the electronic cassette 20 (the radiation detection device 26), there are cases in which the electronic cassette 20 may not suitably detect an irradiation start or an irradiation end.

It is generally known that rising profiles and falling profiles differ depending on kinds of the radiation generation device 12 and the like. The rising profile and the falling profile differ depending on the kind of power supply 22 of the radiation generation device 12; for example, the profiles differ depending on whether the power supply 22 is a DC power supply or an AC power supply. The rising profile and falling profile also differ depending on the type of the high-voltage generation device 24 of the radiation generation device 12; for example, the profiles differ depending on whether the high-voltage generation device 24 is of a single-phase transformer type, a three-phase transformer type, an inverter type or a condenser type. The rising profile and falling profile also differ depending on the form of the radiation generation device 12; for example, the profiles differ between a fitted form and a mobile form.

Figure 8:
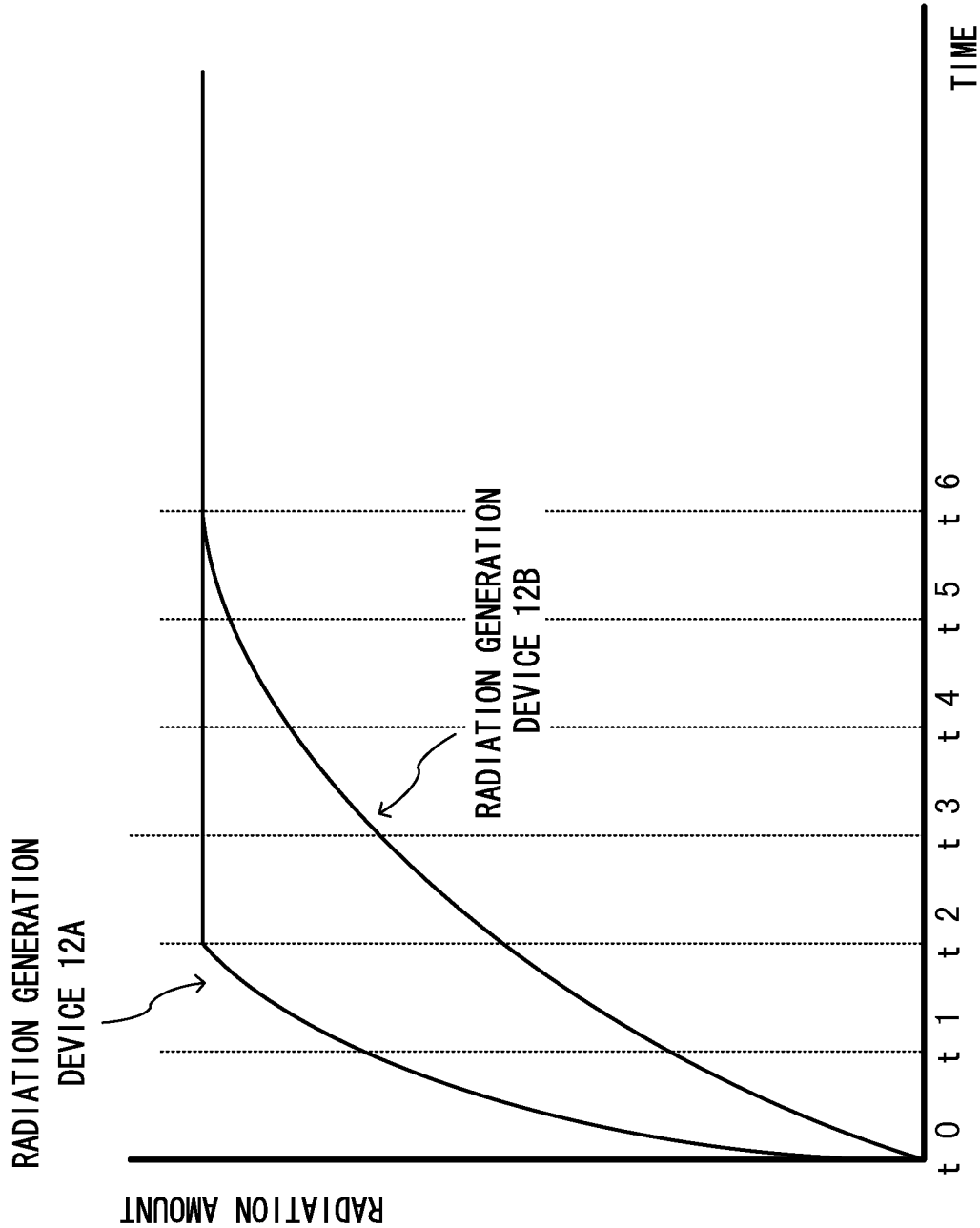
FIG. 8 is an explanatory diagram for describing a rising profile of radiation irradiated from a radiation generation device in accordance with the present exemplary embodiment.

Concrete examples in which irradiation starts may not be suitably detected due to differences in rising profiles are described. FIG. 8 is an explanatory diagram for describing rising profiles of the radiation X irradiated from the radiation generation device 12. FIG. 8 illustrates a rising profile of radiation X irradiated from a radiation generation device 12A and a rising profile of radiation X irradiated from a radiation generation device 12B. Both the radiation generation device 12A and the radiation generation device 12B are for irradiating the same radiation amount (hereinafter referred to as "the predetermined radiation amount") but differ in the profiles before the predetermined radiation amount is reached. With the radiation generation device 12A, the radiation amount increases (rises) to reach the predetermined radiation amount rapidly. With the radiation generation device 12B, the radiation amount increases (rises) to reach the predetermined radiation amount steadily. As shown in FIG. 8, an amount of change of the radiation amount per unit time with the radiation generation device 12A is greater than that with the radiation generation device 12B (in this case, a unit of time is t0-t1, t1-t2, t2-t3, t3-t4, t4-t5 or t5-t6, which are all equal). The meaning of the term "amount of change" as used in the present exemplary embodiment includes absolute values. Correspondingly, the duration in which the radiation generation device 12B reaches the predetermined radiation amount is longer than that of the radiation generation device 12A.

Consider a case in which, based on the rising profile of the radiation generation device 12A, the start detection parameter is, for example, a threshold value determined in accordance with the amount of change in radiation amounts in t0-t1. When the amount of change of the radiation amount per unit time detected by the radiation detection section 160 is at or above the threshold value, it is detected that an irradiation of the radiation X has started. In a case in which the radiation X is being irradiated by the radiation generation device 12A, the amount of change of the radiation amount in t0-t1 is at least the threshold value. Therefore, the radiation detection section 160 can appropriately detect the start of an irradiation of the radiation X. However, in a case in which the radiation X is being irradiated by the radiation generation device 12B, the amount of change of the radiation amount is smaller than that of the radiation generation device 12A. Consequently, the amount of change of the radiation amount does not go above the threshold value in any unit of time from t0 to t6. Because the threshold value is not matched or exceeded, the radiation detection section 160 cannot detect the start of an irradiation of the radiation X.

Now consider a case in which, based on the rising profile of the radiation generation device 12B, the start detection parameter is, for example, a number of times the amount of change is successively at least a threshold value. As a specific example, the threshold value is the amount of change of the radiation amount in t3-t4 in the rising profile of the radiation generation device 12B, and the number of times is 4. When the number of times the amount of change of the radiation amount per unit time detected by the radiation detection section 160 is successively at or above the threshold value is at least the number of times set as the start detection parameter, it is detected that an irradiation of the radiation X has started. In a case in which the radiation X is being irradiated by the radiation generation device 12B, the amount of change of the radiation amount is at least the threshold value in t0-t1, t1-t2, t2-t3 and t3-t4. Therefore, the radiation detection section 160 can appropriately detect the irradiation start of the radiation X. However, in a case in which the radiation X is being irradiated by the radiation generation device 12A, the number of times the amount of change of the radiation amount is at least the threshold value is smaller than with the radiation generation device 12B. Because the number of times is small, the radiation detection section 160 cannot detect the irradiation start of the radiation X.

Now consider a case in which the start detection parameter is a threshold value set to the amount of change of the radiation amount in t3-t4 in the rising profile of the radiation generation device 12B. When the amount of change of the radiation amount per unit time detected by the radiation detection section 160 is at or above the threshold value, it is detected that an irradiation of the radiation X has started. In a case in which the radiation X is being irradiated by the radiation generation device 12A, an irradiation start of the radiation X can be appropriately detected. Meanwhile, in a case in which the radiation X is being irradiated by the radiation generation device 12B, the amount of change of the radiation amount exceeds the threshold value in t0-t1, so the irradiation start of the radiation X is detected by the radiation detection section 160. However, a longer duration than with the radiation generation device 12A is required from when the irradiation start is detected until the predetermined radiation amount is reached, so this is unsuitable.

Figure 9:
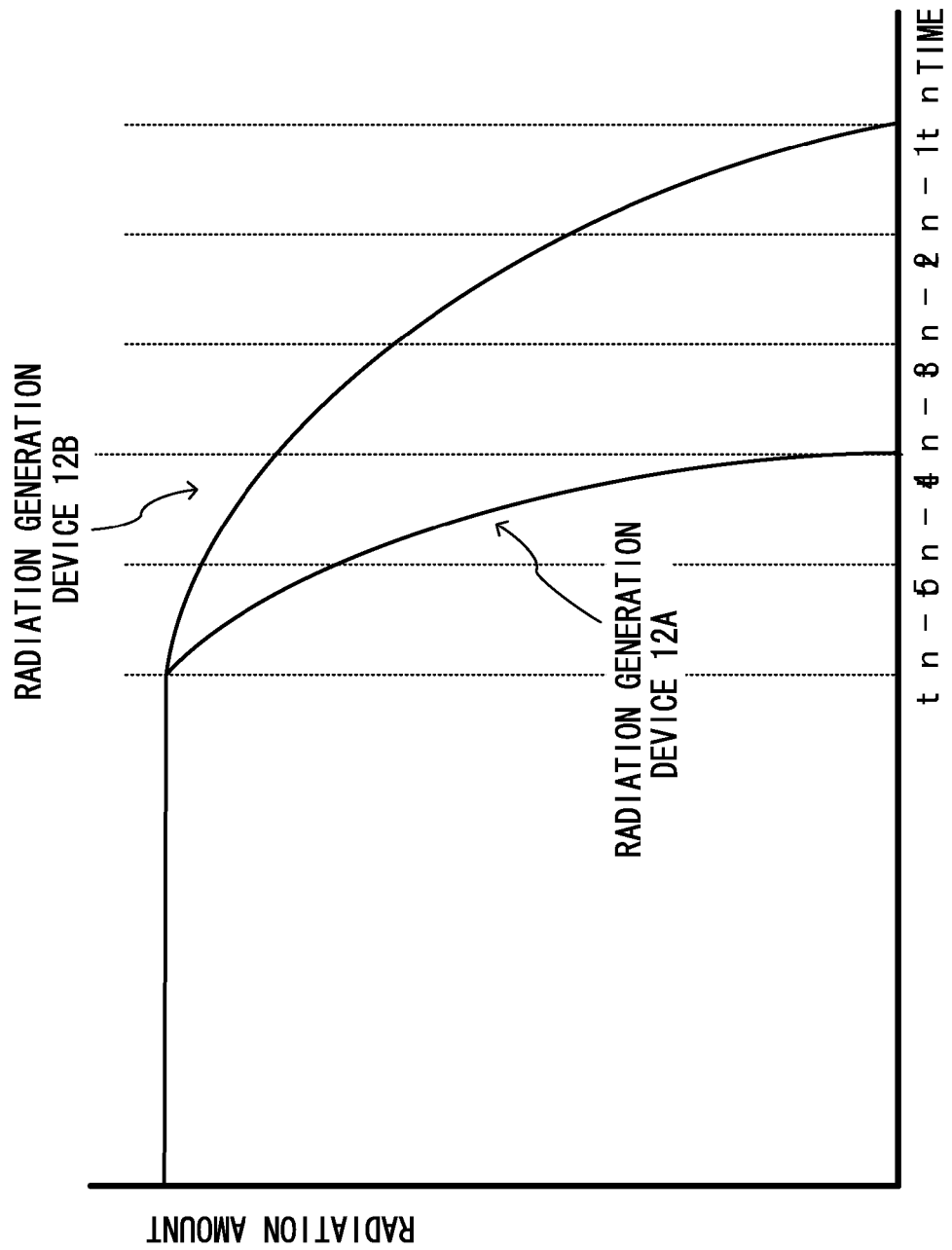
FIG. 9 is an explanatory diagram for describing a falling profile of the radiation irradiated from the radiation generation device in accordance with the present exemplary embodiment.

Concrete examples in which irradiation ends may not be suitably detected due to differences in falling profiles are now described. FIG. 9 is an explanatory diagram for describing profiles of falls of the radiation X irradiated from the radiation generation device 12. FIG. 9 illustrates a falling profile of radiation X irradiated from the radiation generation device 12A and a falling profile of radiation X irradiated from the radiation generation device 12B.

When an irradiation ends, both the radiation generation device 12A and the radiation generation device 12B fall from the predetermined radiation amount to a minimum radiation amount, but differ in the profiles before the minimum radiation amount is reached. The meaning of the term "minimum radiation amount" as used in the present exemplary embodiment includes a radiation amount in a state in which there is no irradiation from the radiation generation device 12 or the like, taking account of radiation amounts of radiation generated from outside the radiation generation device 12 such as, for example, radiation from the natural environment. With the radiation generation device 12A, the radiation amount decreases (falls) to reach the minimum radiation amount rapidly. With the radiation generation device 12B, the radiation amount decreases (falls) to reach the minimum radiation amount steadily. As shown in FIG. 9, similarly to the above-described detection of the start of an irradiation, an amount of change of the radiation amount per unit time from the radiation generation device 12A is greater than that from the radiation generation device 12B (in this case, a unit of time is $t_n-5-t_n-4$, $t_n-4-t_n-3$, $t_n-3-t_n-2$, $t_n-2-t_n-1$ or $t_n-1-t_n$, which are all equal). Correspondingly, the duration in which the radiation generation device 12B reaches the minimum radiation amount is longer than that of the radiation generation device 12A.

Therefore, similarly to the above-described detection of an irradiation start, consider a case in which, based on the falling profile of the radiation generation device 12A, the end detection parameter is, for example, a threshold value determined in accordance with the amount of change in the radiation amount in $t_n-4-t_n-3$. When the amount of change of the radiation amount per unit time detected by the radiation detection section 160 is at or above the threshold value, it is detected that an irradiation of the radiation X has ended. In a case in which the radiation X is being irradiated by the radiation generation device 12A, the amount of change of the radiation amount in $t_n-4-t_n-3$ is at least the threshold value. Therefore, the radiation detection section 160 can appropriately detect a radiation X irradiation end. However, in a case in which the radiation X is being irradiated by the radiation generation device 12B, the amount of change of the radiation amount is smaller than that of the radiation generation device 12A. Consequently, the amount of change of the radiation amount does not go above the threshold value in any unit of time from $t_n-5$ to $t_n$. Because the threshold value is not matched or exceeded, the radiation detection section 160 cannot detect a radiation X irradiation end.

Now consider a case in which, based on the falling profile of the radiation generation device 12B, the end detection parameter is, for example, a number of times the amount of change is successively at least a threshold value. As a specific example, the threshold value is the amount of change of the radiation amount in $t_n-4-t_n-3$ in the profile of the fall of the radiation generation device 12B, and the number of times is 4. When the number of times the amount of change of the radiation amount per unit time detected by the radiation detection section 160 is successively at or above the threshold value is at least the number of times set as the end detection parameter, it is detected that an irradiation of the radiation X has ended. In a case in which the radiation X is being irradiated by the radiation generation device 12B, the amount of change of the radiation amount is at least the threshold value in $t_n-4-t_n-3$, $t_n-3-t_n-2$, $t_n-2-t_n-1$ and $t_n-1-t_n$. Therefore, the radiation detection section 160 can appropriately detect a radiation X irradiation end. However, in a case in which the radiation X is being irradiated by the radiation generation device 12A, the number of times the amount of change of the radiation amount is at least the threshold value is smaller than with the radiation generation device 12B. Because the number of times is small, the radiation detection section 160 cannot detect a radiation X irradiation end.

Now consider a case in which the amount of change of the radiation amount in $t_n-5-t_n-4$ in the falling profile of the radiation generation device 12B is set as the threshold value. When the amount of change of the radiation amount per unit time detected by the radiation detection section 160 is at or above the threshold value, it is detected that an irradiation of the radiation X has ended. In a case in which the radiation X is being irradiated by the radiation generation device 12A, the end of an irradiation of the radiation X can be appropriately detected. Meanwhile, in a case in which the radiation X is being irradiated by the radiation generation device 12B, the amount of change of the radiation amount exceeds the threshold value in $t_n-5-t_n-4$, so the radiation X irradiation end is detected by the radiation detection section 160. However, a longer duration than with the radiation generation device 12A is required from when the irradiation end is detected until the minimum radiation amount is reached, so this is unsuitable. For example, the irradiation end is detected even though the radiation X is actually being irradiated. Consequently, the electronic cassette 20 ends an accumulation period in which charges generated in the sensor portions 103 are accumulated, and switches to a reading period in which the accumulated charges are read out. Therefore, the accumulation period is shortened. Moreover, if the electronic cassette 20 switches into the reading period while the radiation X is still being irradiated, there is a possibility that the effects of the irradiated radiation X will produce noise in the radiation image.

Thus, there are cases in which irradiation starts and irradiation ends may not be appropriately detected because of the profiles of the radiation X irradiated onto the electronic cassette 20. Accordingly, in the electronic cassette 20 according to the present exemplary embodiment, the rising profile and falling profile corresponding to the radiation generation device 12 are acquired and the start detection parameter and end detection parameter are set.

Figure 10:
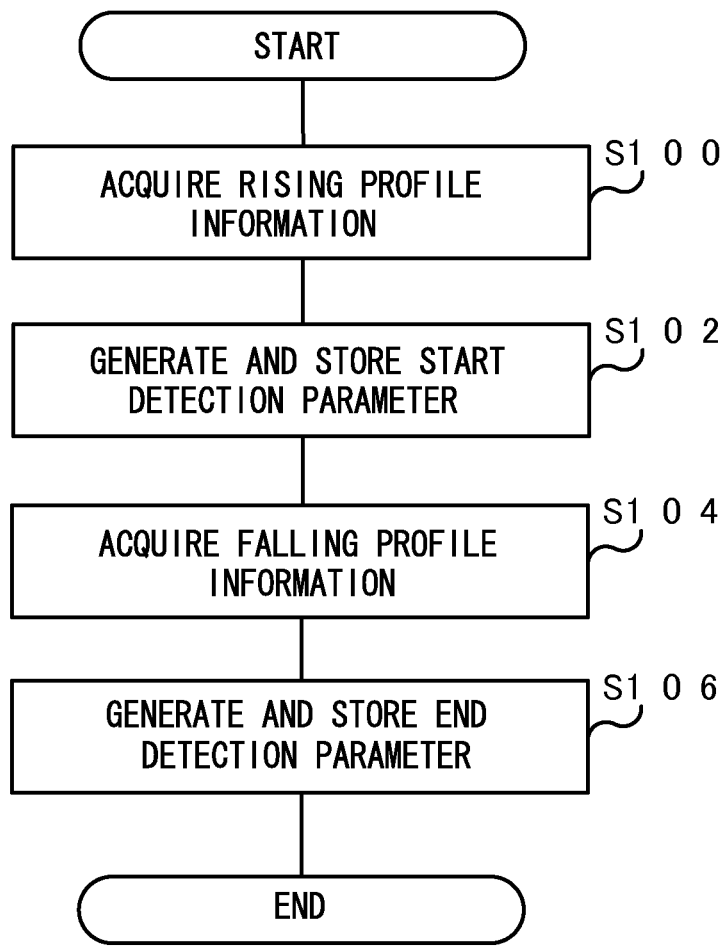
FIG. 10 is a flowchart showing an example of the flow of profile information acquisition processing in accordance with the present exemplary embodiment.

In the present exemplary embodiment, first, rising profile information and falling profile information are acquired. Hereinafter, where the rising profile and the falling profile are collectively referred to, they are referred to simply as "profile information". FIG. 10 is a flowchart showing the flow of an example of profile information acquisition processing in accordance with the present exemplary embodiment. In the present exemplary embodiment, the profile information acquisition processing shown in FIG. 10 is executed by the controller 106 of the electronic cassette 20. This profile information acquisition processing is performed at predetermined times, such as before the start of imaging of a radiation image, during maintenance of the radiation image capture system 10, when the radiation generation device 12 is changed, and the like.

In the present exemplary embodiment, the radiation X is irradiated at the electronic cassette 20 from the radiation generation device 12 and profile information is acquired in a state in which no subject, including the imaging subject 30, is disposed therebetween. The profile information acquisition processing shown in FIG. 10 is executed when an irradiation of the radiation X from the radiation generation device 12 is to be started. At this time, the radiation image processing device 14, the console 16 or the like may instruct the electronic cassette 20 that an irradiation of the radiation X from the radiation generation device 12 is starting.

In step S100, the radiation X irradiated from the radiation generation device 12 is measured and a rising profile is acquired by the profile acquisition section 161. A method of acquisition of the rising profile is not particularly limited. For example, a method of detecting radiation amounts at predetermined timings over a predetermined period, a method of detecting radiation amounts at predetermined timings until a predetermined radiation amount is reached, and suchlike can be mentioned. Which method is to be used may be determined beforehand in accordance with characteristics of the radiation generation device 12 or the like.

Then, in step S102, the parameter setting section 164 generates a start detection parameter on the basis of the acquired rising profile and stores the start detection parameter in the storage section 162. What kind of start detection parameter is to be used is not particularly limited. For example, if the duration until a predetermined radiation amount is reached is A seconds, (the predetermined amount×the unit of time×(1/A)) may be specified as a threshold value. Alternatively, the number of times an amount of change per unit time is successively above a threshold value may be specified as the start detection parameter. This may be determined in accordance with a characteristic of the rising profile of the radiation generation device 12 or the like.

In step S104, the radiation X irradiated from the radiation generation device 12 is measured and a falling profile is acquired by the profile acquisition section 161. A method of acquisition of the falling profile is not particularly limited. For example, a method of detecting radiation amounts at predetermined timings over a predetermined period, a method of detecting radiation amounts at predetermined timings from a predetermined radiation amount until a minimum radiation amount is reached, and suchlike can be mentioned. Which method is to be used may be determined beforehand in accordance with characteristics of the radiation generation device 12 or the like.

In step S106, the parameter setting section 164 generates an end detection parameter on the basis of the acquired falling profile and stores the end detection parameter in the storage section 162, after which the present processing ends. Similarly to the start detection parameter, the end detection parameter is not particularly limited. For example, if the duration from the predetermined radiation amount until a minimum radiation amount is reached is B seconds, (the predetermined amount×the unit of time×(1/B)) may be specified as a threshold value. Alternatively, the number of times an amount of change per unit time is successively above a threshold value may be specified as the end detection parameter. This may be determined in accordance with a characteristic of the falling profile of the radiation generation device 12 or the like.

Consequent to this profile information acquisition processing, a start detection parameter and end detection parameter generated on the basis of profile information corresponding to the radiation generation device 12 are stored in the storage section 162.

Figure 11:
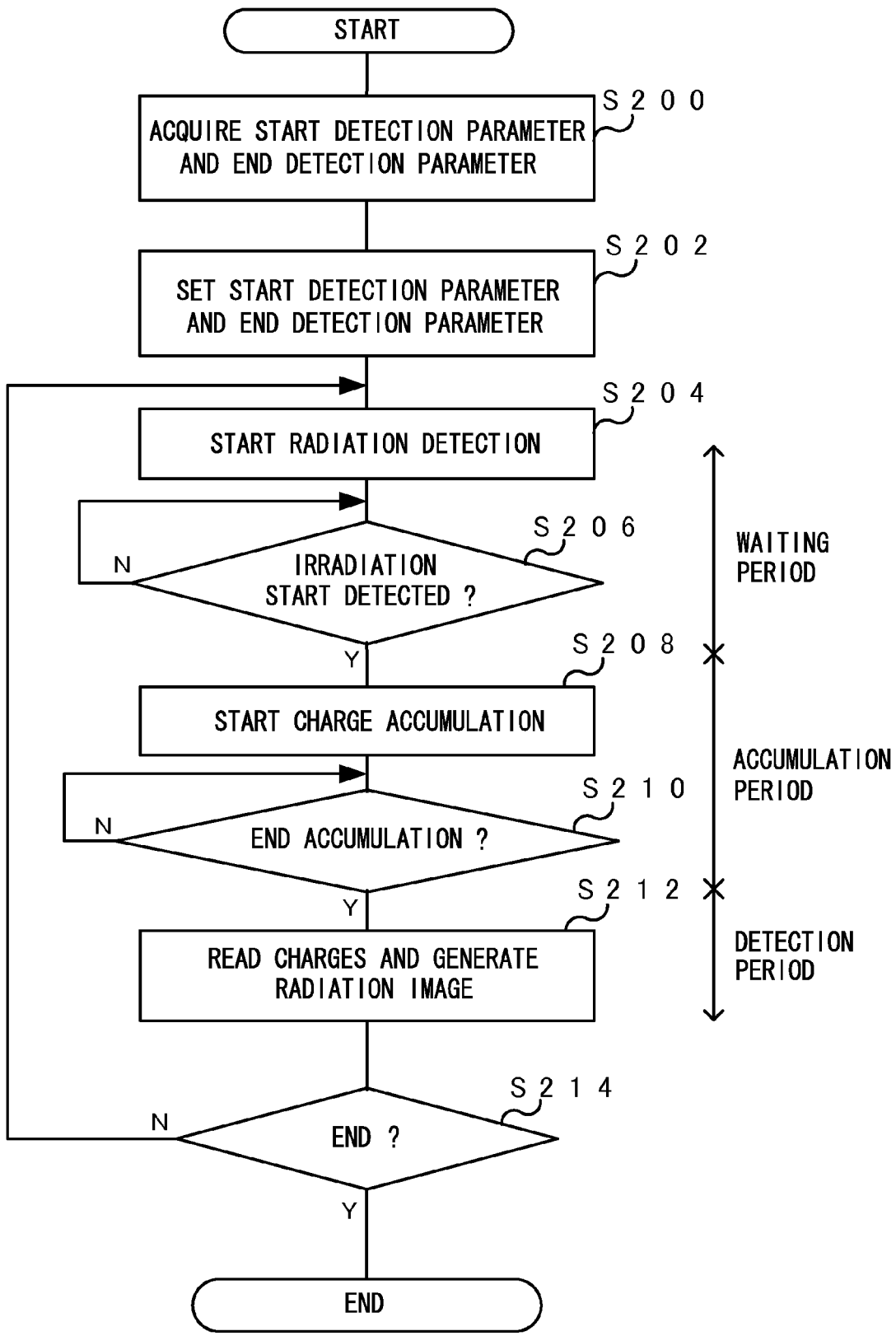
FIG. 11 is a flowchart showing the flow of an example of radiation image capture processing at the electronic cassette in accordance with the present exemplary embodiment.

Next, radiation image capture processing in accordance with the present exemplary embodiment is described. FIG. 11 is a flowchart showing the flow of an example of the radiation image capture processing in the electronic cassette 20 according to the present exemplary embodiment. The radiation image capture processing shown in FIG. 11 is executed when imaging of a radiation image is instructed.

In step S200, the start detection parameter and end detection parameter are acquired. Then, in step S202, the acquired start detection parameter and end detection parameter are set at the parameter setting section 164. In a case in which the radiation image capture processing is performed in continuation from the above-described profile information acquisition processing, the start detection parameter and end detection parameter need not be stored in the storage section 162 in the profile information acquisition processing but may be directly set at the parameter setting section 164. In a case in which start detection parameters and end detection parameters are included in imaging menu items, the start detection parameter and end detection parameter may be acquired and set from these imaging menu items. Consequent to this processing, a start detection parameter and end detection parameter corresponding to the radiation generation device 12 are set at the parameter setting section 164.

When the start detection parameter and end detection parameter have been set as described above, in step S204, the radiation detection section 160 starts detection for an irradiation of the radiation X and switches into an irradiation start detection waiting period. Then, in step S206, a determination is made as to whether a radiation X irradiation start has been detected.

When the radiation is irradiated from the radiation generation device 12, the irradiated radiation X is absorbed at the scintillator and converted to visible light. The light that has been converted to visible light by the scintillator is irradiated onto the sensor portions 103 of the pixels 100. When the light is irradiated on the sensor portions 103, charges are generated inside the sensor portions 103. The generated charges are collected by the lower electrodes 81.

In each radiation image capture pixel 100A, because the drain electrode 83 and the source electrode 79 are not short-circuited, the charges collected at the lower electrode 81 are accumulated. However, in each radiation detection pixel 100B, because the drain electrode 83 and the source electrode 79 are short-circuited, the charges collected at the lower electrode 81 flow out into the signal line 73.

In the electronic cassette 20 according to the present exemplary embodiment, as described above, the electronic signals (charge information) outputted from the radiation detection pixels 100B are detected by the amplification circuits 120 of the signal detection circuit 105. The radiation detection section 160 compares the detected electronic signals (charge information) with the start detection parameter set at the parameter setting section 164, and thus detects the start of an irradiation of the radiation X as described above. Here, the radiation amounts of the radiation X irradiated onto the electronic cassette 20 after passing through an imaging target region of the imaging subject 30 are smaller than the radiation amounts that were irradiated during the above-described profile information acquisition processing. However, because the two profiles have similar shapes, this is not a problem. If the radiation X irradiation start has not been detected, the result of the determination is negative and the controller 106 stays in the waiting state. On the other hand, when an irradiation start is detected, the result of the determination is affirmative, and the controller 106 advances to step S208 and switches into the accumulation period in which charges are accumulated. Hence, in step S208 the accumulation of charges generated in accordance with the irradiated radiation X is started.

At each radiation image capture pixel 100A of the radiation detection device 26, the TFT switch 74 stays in the off state. Therefore, the radiation image capture pixel 100A is in a state in which charges are accumulated. In contrast, at each radiation detection pixel 100B the TFT switch 74 is short-circuited. Therefore, the radiation detection pixel 100B outputs charges to the signal detection circuit 105 even in the charge accumulation period (while the TFT switches 74 are turned off). The sample-and-hold switches SW are turned on and off at predetermined timings, and information of the charges outputted from the radiation detection pixels 100B is inputted to the controller 106 as electronic signals (charge information), via the amplification circuits 120 and ADC 124 of the signal detection circuit 105.

In step S210, a determination is made as to whether the accumulation of charges is to end. In the present exemplary embodiment, the radiation detection section 160 compares the detected electronic signals (charge information) with the end detection parameter set at the parameter setting section 164, and thus detects for a radiation X irradiation end as described above. If the radiation X irradiation end has not been detected, the result of the determination is negative and the accumulation of charges continues. On the other hand, when the irradiation end is detected, the accumulation period is to end. Accordingly, the result of the determination is affirmative, and the controller 106 advances to step S212 and switches into the reading period. In step S212, charges are read out from the pixels 100, and a radiation image is generated on the basis of the read-out charges and outputted. Specifically, in the reading period, on signals are sequentially applied to the gate electrodes 72 of the TFT switches 74 via the gate lines 101. Thus, the TFT switches 74 of the pixels 100A are sequentially turned on, and the electronic signals according to the charge amounts accumulated at the pixels 100A are outputted to the signal lines 73. Thus, the charges are read out.

In step S214, a determination is made as to whether imaging is to end. In a case of continuous imaging, such as video imaging or the like, the result of the determination is negative, the controller 106 returns to step S204, and the present processing is repeated. Alternatively, in a case in which the imaging is to end, the result of the determination is affirmative and the present processing ends. Thus, in the electronic cassette 20 according to the present exemplary embodiment, one frame of radiation images (one radiation image) is captured by a waiting period of waiting for the detection of a radiation X irradiation start, an accumulation period in which the radiation image capture pixels 100A accumulate charges generated in accordance with the irradiated radiation X, and a reading period in which the accumulated charges are read out.

As described hereabove, in the electronic cassette 20 of the radiation image capture system 10 according to the present exemplary embodiment, profile information (a rising profile and a falling profile) is acquired on the basis of radiation X irradiated from the radiation generation device 12. A start detection parameter and an end detection parameter are generated on the basis of the acquired profile information, and are stored at the storage section 162 or set at the parameter setting section 164. When a radiation image is being captured, the radiation detection section 160 detects a radiation X irradiation start and irradiation end in accordance with a start detection parameter and end detection parameter that have been set.

Therefore, a radiation X irradiation start and irradiation end may be detected using a start detection parameter and end detection parameter corresponding to characteristics (a kind) of the radiation generation device 12. Radiation X irradiation starts and irradiation ends may not be appropriately detected because of differences in profile information. Accordingly, the electronic cassette 20 may be controlled in accordance with the radiation generation device 12. Furthermore, because the radiation X irradiation start and irradiation end may be appropriately detected, unnecessary exposures of the imaging subject 30 due to re-imaging and the like may be suppressed. Further still, the image quality of captured radiation images may be improved.

In the present exemplary embodiment, a case is described in which the electronic cassette 20 acquires profile information and generates and sets a start detection parameter and an end detection parameter, but this is not limiting. For example, a structure is possible in which the radiation image processing device 14, the console 16 or the like generates the start detection parameter and end detection parameter and sets the same at the electronic cassette 20.

In the present exemplary embodiment, a case is described in which the start detection parameter and end detection parameter are stored at the storage section 162, but this is not limiting. For example, the acquired profile information itself may be stored, and the start detection parameter and end detection parameter generated and set from the stored profile information when appropriate, when a radiation image is to be captured or the like.

In the present exemplary embodiment, the radiation X irradiated from the radiation generation device 12 is measured to acquire the profile information, but this is not limiting. For example, a structure is possible in which the profile information is acquired from externally via the interface section 166.

The profile information acquired by the aforementioned profile information acquisition processing, or the start detection parameter and end detection parameter or the like may be stored in the storage section 162 in relation to the radiation generation device 12, and the profile information, start detection parameter and end detection parameter or the like may be stored for each of plural kinds of the radiation generation device 12. Thus, when a radiation image is to be captured, which radiation generation device 12 is being used may be acquired from an imaging menu or the like. Hence, an appropriate start detection parameter and end detection parameter may be set.

In the present exemplary embodiment, a case is described in which both the start detection parameter and the end detection parameter are set and the radiation X irradiation start and irradiation end are detected, but this is not limiting. One or other of the parameters may be set, such that either the start or the end may be detected.

Structures and methods for detecting a radiation X irradiation start with the electronic cassette 20 itself are not limited to the present exemplary embodiment. For example, in the above descriptions, the radiation detection pixels 100B are described as each being a pixel equipped with the TFT switch 74 in which the source and drain are short-circuited, but this is not limiting. For example, connection wiring may be formed from partway along the drain electrode 83 and connected to the signal line 73. In this case too, the source and drain of the TFT switch 74 are substantially short-circuited. In a case in which the source and drain of the TFT switch 74 are short-circuited, the gate electrode 72 may be formed away from the gate line 101. As a further example, in each radiation detection pixel 100B, the sensor portion 103 may be connected with the signal line 73 via the interlayer insulation film 82 and the contact hole 87. Thus, the drain electrode 83 and the contact hole 87 are electrically disconnected.

In the present exemplary embodiment, a case is described in which pixels in which the TFT switches 74 are short-circuited are used as the radiation detection pixels 100B, but the radiation detection pixels 100B are not particularly limited. For example, pixels in which the TFT switches 74 are not short-circuited may be used as the radiation detection pixels 100B. In this case, control of the TFT switches 74 of the radiation detection pixels 100B is separate from control of the TFT switches 74 of the radiation image capture pixels 100A. Moreover, predetermined pixels 100 of the radiation detection device 26 may be used as the radiation detection pixels 100B, and pixels that are different from the pixels 100 in the radiation detection device 26 may be provided.

In the radiation detection device 26 of the electronic cassette 20 according to the present exemplary embodiment (see FIG. 3), the radiation detection pixels 100B are connected to some of the signal lines 73, but this is not limiting. The radiation detection pixels 100B may be provided at positions that are connected to all of the signal lines 73. Positions at which the radiation detection pixels 100B are provided are not particularly limited.

In the present exemplary embodiment, a case is described in which the present invention is applied to the radiation detection device 26 of an indirect conversion type that converts converted light to charges, but this is not limiting. For example, the present invention may be applied to a radiation detection device of a direct conversion type that employs a material that converts radiation X directly to charges, such as amorphous selenium or the like, as the photoelectric conversion layer that absorbs radiation and converts the radiation to charges.

In other respects, structures, operations and the like of the radiation image capture system 10, the radiation generation device 12, the electronic cassette 20, the radiation detection device 26 and the like described in the present exemplary embodiment are examples and it will it clear that these may be modified in accordance with conditions within a scope not departing from the spirit of the present invention.

The radiation X of the present exemplary embodiment is not particularly limited; X-rays, gamma rays and so forth may be employed.

A control condition determination unit of the radiation detection device of the present invention may include a threshold setting unit that, on the basis of acquired profile information, sets a threshold corresponding to an amount of change per unit time of radiation amounts of irradiated radiation, and if an amount of change per unit time of radiation amounts of irradiated radiation is at least the threshold set by the threshold setting unit, a controller may control a radiation detection unit.

The control condition determination unit of the radiation detection device of the present invention may include a threshold setting unit that, on the basis of the acquired profile information, sets a threshold and a designated number of times, and if a number of times that an amount of change per unit time of radiation amounts of irradiated radiation is at least the threshold set by the threshold setting unit reaches the designated number of times, the controller may control the radiation detection unit.

A profile information acquisition unit of the radiation detection device of the present invention may acquire the profile information of a radiation irradiation device on the basis of radiation amounts of radiation irradiated from the radiation irradiation device and detected by the radiation detection device.

A radiation detection unit of the radiation detection device of the present invention may include: pixels for radiation detection from which charges to which radiation irradiated from the radiation irradiation device is converted are continuously read out; and pixels for radiation image capture that are equipped with switching elements for reading out the charges, and the controller may control the pixels for radiation image capture in accordance with the radiation detected at the pixels for radiation detection and a control condition of the radiation detection unit.

The profile information acquisition unit of the radiation detection device of the present invention may acquire rising profile information representing changes over time of radiation amounts of the radiation irradiated from the radiation irradiation device, from the start of an irradiation until a predetermined radiation amount is reached, the control condition determination unit may determine a charge accumulation start condition of the radiation detection unit on the basis of the rising profile information acquired by the profile information acquisition unit, and the controller may start charge accumulation at the radiation detection unit in accordance with the accumulation start condition determined by the control condition determination unit.

The profile information acquisition unit of the radiation detection device of the present invention may acquire falling profile information representing changes over time of radiation amounts of the radiation irradiated from the radiation irradiation device, from a predetermined radiation amount until a minimum radiation amount is reached, the control condition determination unit may determine a charge accumulation end condition of the radiation detection unit on the basis of the falling profile information acquired by the profile information acquisition unit, and the controller may end charge accumulation at the radiation detection unit in accordance with the accumulation end condition determined by the control condition determination unit.

The radiation detection device of the present invention may further include a storage unit that stores respective profile information of plural kinds of the radiation irradiation device.

The radiation detection device of the present invention may further include a storage unit that stores respective control conditions of the radiation detection unit in correspondence with respective profile information of plural kinds of the radiation irradiation device.

According to the present invention, an effect is provided that a radiation detection unit may be controlled in accordance with a radiation irradiation device.

What is claimed is:

1. A radiation detection device comprising:
  a radiation detection unit that converts radiation irradiated from a radiation irradiation device to charges and accumulates the charges;
  a profile information acquisition unit that acquires profile information representing a change per unit time of radiation amounts of the radiation irradiated from the radiation irradiation device;
  a control condition determination unit that determines a control condition of the radiation detection unit on the basis of the profile information acquired by the profile information acquisition unit; and
  a controller that controls the radiation detection unit in accordance with the control condition determined by the control condition determination unit.

2. The radiation detection device according to claim 1, wherein the control condition determination unit includes a threshold setting unit that, on the basis of the acquired profile information, sets a threshold corresponding to an amount of change per unit time of radiation amounts of irradiated radiation, and if an amount of change per unit time of radiation amounts of irradiated radiation is at least the threshold set by the threshold setting unit, the controller controls the radiation detection unit.

3. The radiation detection device according to claim 2, wherein the profile information acquisition unit acquires the profile information of the radiation irradiation device on the basis of radiation amounts of radiation irradiated from the radiation irradiation device and detected by the radiation detection device.

4. The radiation detection device according to claim 2, wherein the radiation detection unit comprises:

pixels for radiation detection from which the charges to which radiation irradiated from the radiation irradiation device is converted are continuously read out; and pixels for radiation image capture that are equipped with switching elements for reading out the charges, and wherein the controller controls the pixels for radiation image capture in accordance with the radiation detected at the pixels for radiation detection and the control condition of the radiation detection unit.

5. The radiation detection device according to claim 2, wherein the profile information acquisition unit acquires rising profile information representing changes over time of radiation amounts of the radiation irradiated from the radiation irradiation device, from the start of an irradiation until a predetermined radiation amount is reached, the control condition determination unit determines a charge accumulation start condition of the radiation detection unit on the basis of the rising profile information acquired by the profile information acquisition unit, and the controller starts charge accumulation at the radiation detection unit in accordance with the accumulation start condition determined by the control condition determination unit.

6. The radiation detection device according to claim 2, wherein the profile information acquisition unit acquires falling profile information representing changes over time of radiation amounts of the radiation irradiated from the radiation irradiation device, from a predetermined radiation amount until a minimum radiation amount is reached, the control condition determination unit determines a charge accumulation end condition of the radiation detection unit on the basis of the falling profile information acquired by the profile information acquisition unit, and the controller ends charge accumulation at the radiation detection unit in accordance with the accumulation end condition determined by the control condition determination unit.

7. The radiation detection device according to claim 2, further comprising a storage unit that stores respective profile information of a plurality of kinds of the radiation irradiation device.

8. The radiation detection device according to claim 2, further comprising a storage unit that stores respective control conditions of the radiation detection unit in correspondence with respective profile information of a plurality of kinds of the radiation irradiation device.

9. The radiation detection device according to claim 1, wherein the control condition determination unit includes a threshold setting unit that, on the basis of the acquired profile information, sets a threshold and a designated number of times, and if a number of times that an amount of change per unit time of radiation amounts of irradiated radiation is at least the threshold set by the threshold setting unit reaches the designated number of times, the controller controls the radiation detection unit.

10. The radiation detection device according to claim 9, wherein the profile information acquisition unit acquires the profile information of the radiation irradiation device on the basis of radiation amounts of radiation irradiated from the radiation irradiation device and detected by the radiation detection device.

11. The radiation detection device according to claim 9, wherein the radiation detection unit comprises:

pixels for radiation detection from which the charges to which radiation irradiated from the radiation irradiation device is converted are continuously read out; and pixels for radiation image capture that are equipped with switching elements for reading out the charges, and wherein the controller controls the pixels for radiation image capture in accordance with the radiation detected at the pixels for radiation detection and the control condition of the radiation detection unit.

12. The radiation detection device according to claim 9, wherein the profile information acquisition unit acquires rising profile information representing changes over time of radiation amounts of the radiation irradiated from the radiation irradiation device, from the start of an irradiation until a predetermined radiation amount is reached, the control condition determination unit determines a charge accumulation start condition of the radiation detection unit on the basis of the rising profile information acquired by the profile information acquisition unit, and the controller starts charge accumulation at the radiation detection unit in accordance with the accumulation start condition determined by the control condition determination unit.

13. The radiation detection device according to claim 1, wherein the profile information acquisition unit acquires the profile information of the radiation irradiation device on the basis of radiation amounts of radiation irradiated from the radiation irradiation device and detected by the radiation detection device.

14. The radiation detection device according to claim 1, wherein the radiation detection unit comprises:

pixels for radiation detection from which the charges to which radiation irradiated from the radiation irradiation device is converted are continuously read out; and pixels for radiation image capture that are equipped with switching elements for reading out the charges, and wherein the controller controls the pixels for radiation image capture in accordance with the radiation detected at the pixels for radiation detection and the control condition of the radiation detection unit.

15. The radiation detection device according to claim 1, wherein the profile information acquisition unit acquires rising profile information representing changes over time of radiation amounts of the radiation irradiated from the radiation irradiation device, from the start of an irradiation until a predetermined radiation amount is reached, the control condition determination unit determines a charge accumulation start condition of the radiation detection unit on the basis of the rising profile information acquired by the profile information acquisition unit, and the controller starts charge accumulation at the radiation detection unit in accordance with the accumulation start condition determined by the control condition determination unit.

16. The radiation detection device according to claim 1, wherein the profile information acquisition unit acquires falling profile information representing changes over time of radiation amounts of the radiation irradiated from the radiation irradiation device, from a predetermined radiation amount until a minimum radiation amount is reached, the control condition determination unit determines a charge accumulation end condition of the radiation detection unit on the basis of the falling profile information acquired by the profile information acquisition unit, and the controller ends charge accumulation at the radiation detection unit in accordance with the accumulation end condition determined by the control condition determination unit.

17. The radiation detection device according to claim 1, further comprising a storage unit that stores respective profile information of a plurality of kinds of the radiation irradiation device.

18. The radiation detection device according to claim 1, further comprising a storage unit that stores respective control conditions of the radiation detection unit in correspondence with respective profile information of a plurality of kinds of the radiation irradiation device.

19. A non-transient computer readable medium storing a program causing a computer to execute a process for controlling a radiation detection device, the process comprising:

acquiring profile information representing a change per unit time of radiation amounts of radiation irradiated from a radiation irradiation device;

determining a control condition of a radiation detection unit on the basis of the acquired profile information, the radiation detection unit converting radiation irradiated from the radiation irradiation device to charges and accumulating the charges; and controlling the radiation detection unit in accordance with the determined control condition.

20. A control method for a radiation detection device, the method comprising:

acquiring profile information representing a change per unit time of radiation amounts of radiation irradiated from a radiation irradiation device;

determining a control condition of a radiation detection unit on the basis of the acquired profile information, the radiation detection unit converting radiation irradiated from the radiation irradiation device to charges and accumulating the charges; and controlling the radiation detection unit in accordance with the determined control condition.

* * * * *